(12) United States Patent
Watanabe et al.

(10) Patent No.: US 10,644,423 B2
(45) Date of Patent: May 5, 2020

(54) SEMICONDUCTOR MODULE

(71) Applicant: HITACHI AUTOMOTIVE SYSTEMS, LTD., Ibaraki (JP)

(72) Inventors: Tsubasa Watanabe, Tokyo (JP); Hiroaki Hoshika, Ibaraki (JP); Takayuki Yogo, Ibaraki (JP)

(73) Assignee: Hitachi Automotive Systems, Ltd., Ibaraki (JP)

( * ) Notice: Subject to any disclaimer, the term of this patent is extended or adjusted under 35 U.S.C. 154(b) by 0 days.

(21) Appl. No.: 16/348,208

(22) PCT Filed: Oct. 17, 2017

(86) PCT No.: PCT/JP2017/037469
§ 371 (c)(1),
(2) Date: May 8, 2019

(87) PCT Pub. No.: WO2018/088141
PCT Pub. Date: May 17, 2018

(65) Prior Publication Data
US 2019/0267736 A1    Aug. 29, 2019

(30) Foreign Application Priority Data
Nov. 14, 2016   (JP) .................. 2016-221608

(51) Int. Cl.
*H01R 12/00* (2006.01)
*H01R 13/05* (2006.01)
(Continued)

(52) U.S. Cl.
CPC .............. *H01R 13/05* (2013.01); *G01F 1/34* (2013.01); *H01L 23/12* (2013.01); *H01L 25/04* (2013.01);
(Continued)

(58) Field of Classification Search
CPC .... H01R 23/722; H01R 9/096; H01R 9/0735; H01R 13/2414
(Continued)

(56) References Cited

U.S. PATENT DOCUMENTS 5,117,282 A * 5/1992 Salatino ................ H05K 1/189
257/686
6,997,051 B2 * 2/2006 Okazaki ................. G01F 1/684
73/204.22
(Continued)

FOREIGN PATENT DOCUMENTS

JP    2009-289447 A    12/2009
JP    2010-067773 A    3/2010
(Continued)

OTHER PUBLICATIONS

International Search Report of PCT/JP2017/037469 dated Dec. 19, 2017.

*Primary Examiner* — Phuong Chi Thi Nguyen
(74) *Attorney, Agent, or Firm* — Mattingly & Malur, PC

(57) ABSTRACT

A semiconductor module includes: a circuit board on which a first semiconductor chip and a second semiconductor chip are mounted and includes a first through hole formed with a conductor foil therein; a press-fit terminal that is electrically connected to the conductor foil in the first through hole of the circuit board; and a second resin that is disposed on a surface side and a back surface side of the circuit board. Further, the press-fit terminal is provided with a pressure contact portion which is press-fitted into the first through hole and is electrically connected to the conductor foil in the first through hole, and the second resin on the surface side of the circuit board and the second resin on the back surface side of the circuit board are integrally formed via a second resin that is filled in the first through hole.

14 Claims, 23 Drawing Sheets

(51) Int. Cl.
*H01R 12/57* (2011.01)
*H01R 12/58* (2011.01)
*G01F 1/34* (2006.01)
*H02G 3/16* (2006.01)
*H01L 25/18* (2006.01)
*H01L 23/12* (2006.01)
*H01L 25/04* (2014.01)

(52) U.S. Cl.
CPC ............ *H01L 25/18* (2013.01); *H01R 12/57* (2013.01); *H01R 12/58* (2013.01); *H01R 12/585* (2013.01); *H02G 3/16* (2013.01); *H01L 2224/48091* (2013.01); *H01L 2224/73265* (2013.01); *H01L 2924/15192* (2013.01); *H01L 2924/181* (2013.01)

(58) Field of Classification Search
USPC ........................................ 439/68, 66, 67, 91
See application file for complete search history.

(56) References Cited

U.S. PATENT DOCUMENTS

| | | | |
|---|---|---|---|
| 7,294,007 | B1 | 11/2007 | Lawlyes |
| 10,031,006 | B2* | 7/2018 | Watanabe ........... H01L 23/3121 |
| 10,217,684 | B2* | 2/2019 | Watanabe ............... H01L 23/10 |
| 10,344,382 | B2* | 7/2019 | Hane ................. C23C 16/45591 |
| 2017/0115144 | A1 | 4/2017 | Watanabe et al. |
| 2019/0078198 | A1* | 3/2019 | Umehara ............ C23C 16/4405 |
| 2019/0267736 | A1* | 8/2019 | Watanabe ................ H02G 3/16 |

FOREIGN PATENT DOCUMENTS

| | | |
|---|---|---|
| JP | 5117282 B2 | 1/2013 |
| JP | 2015-126614 A | 7/2015 |
| WO | 2016/017299 A1 | 2/2016 |

* cited by examiner

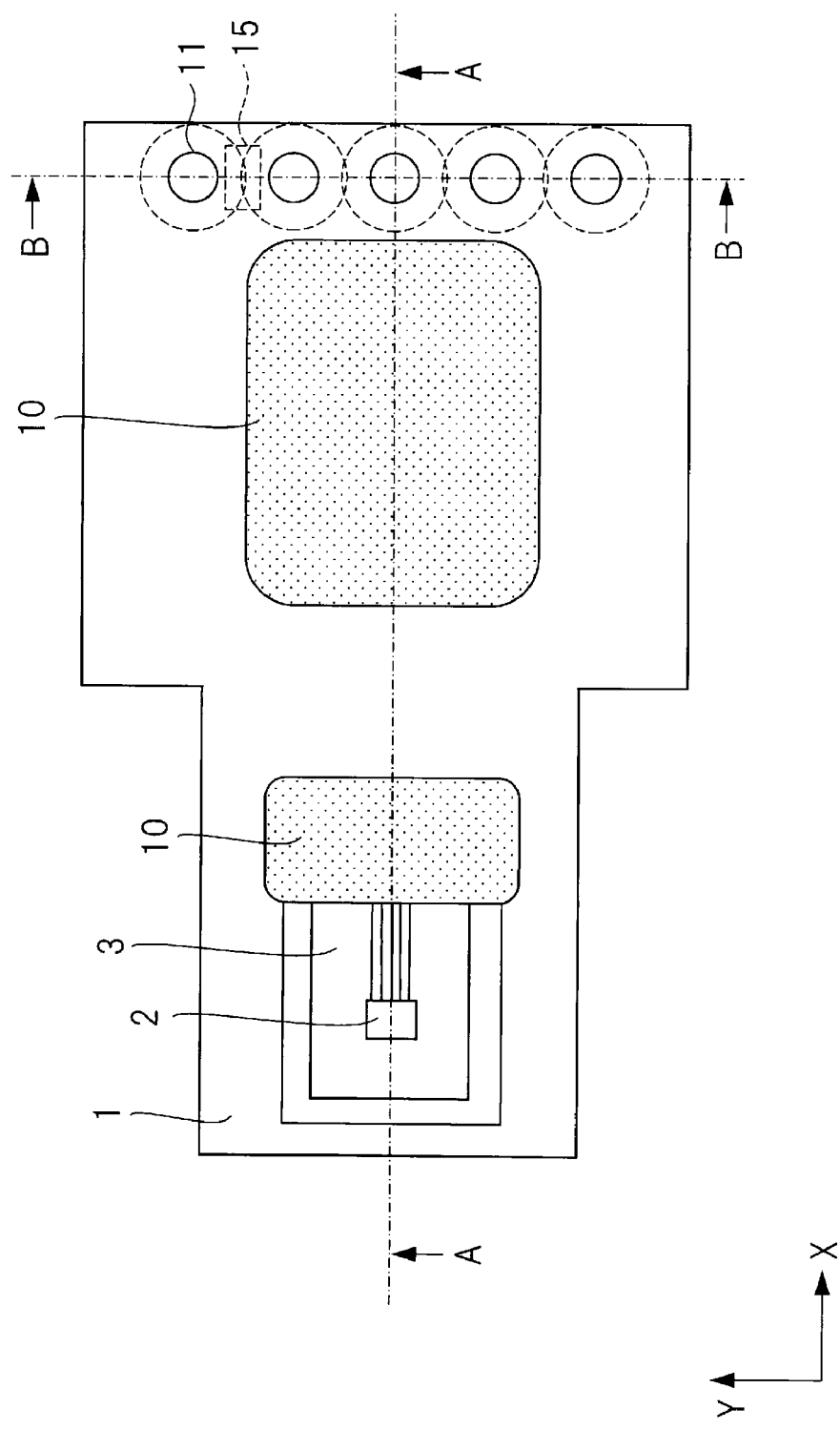

[FIG. 2]
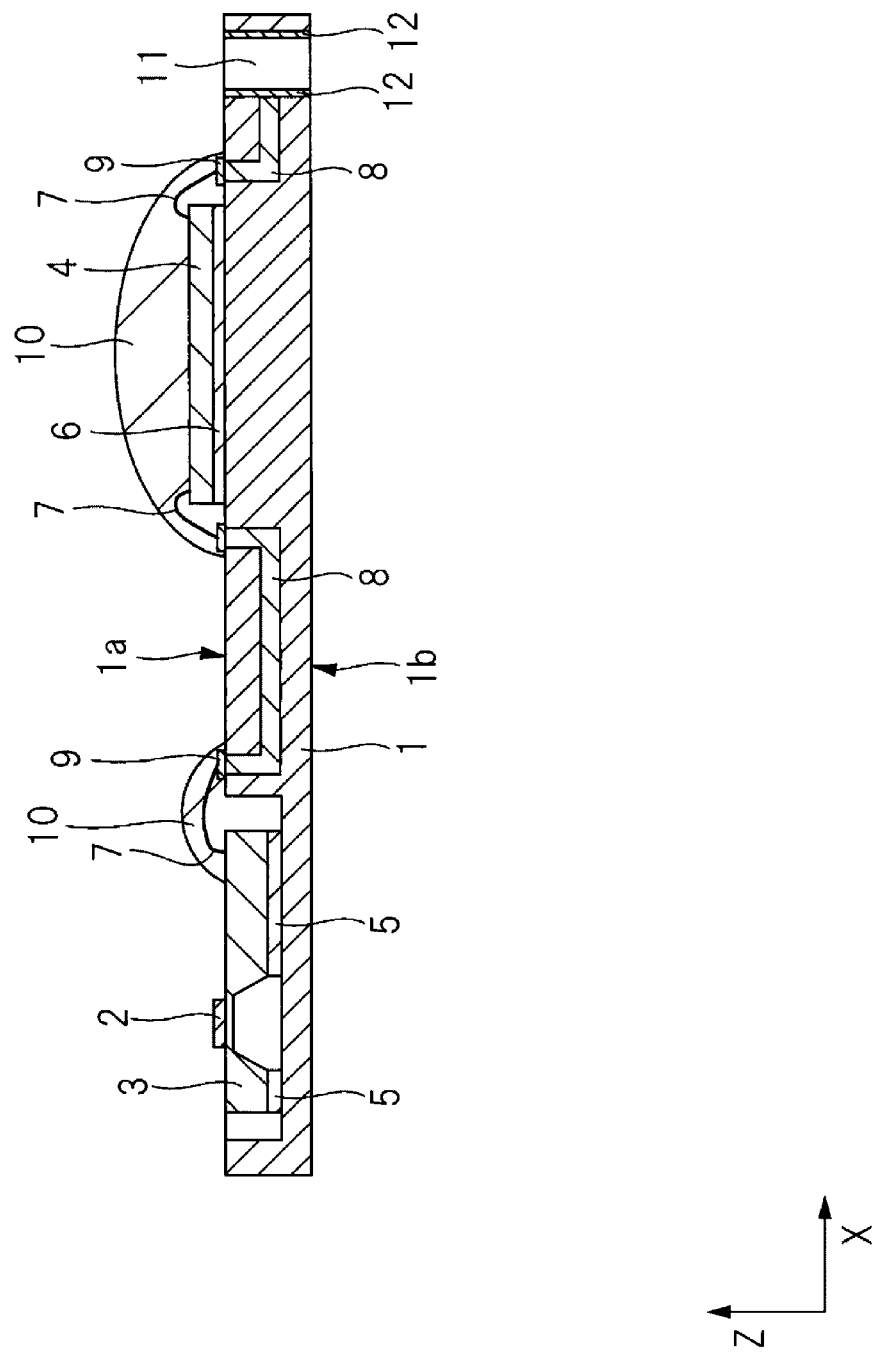

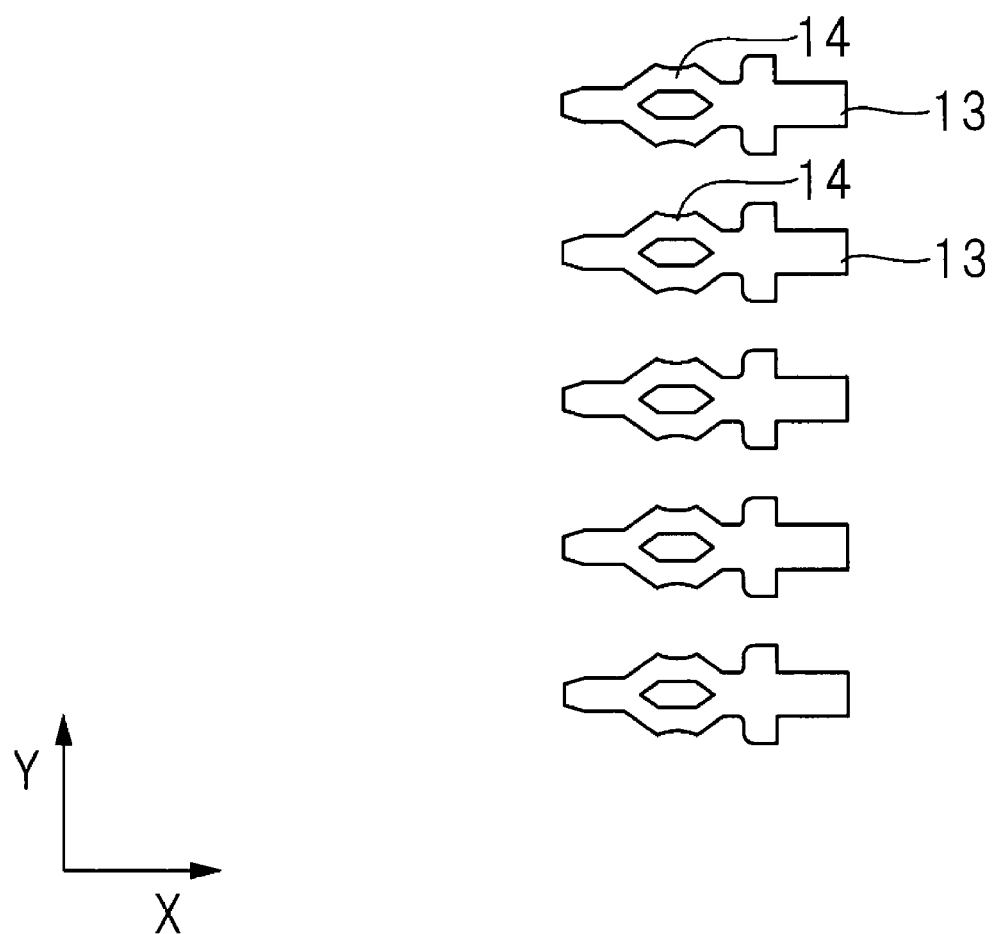

[FIG. 4]
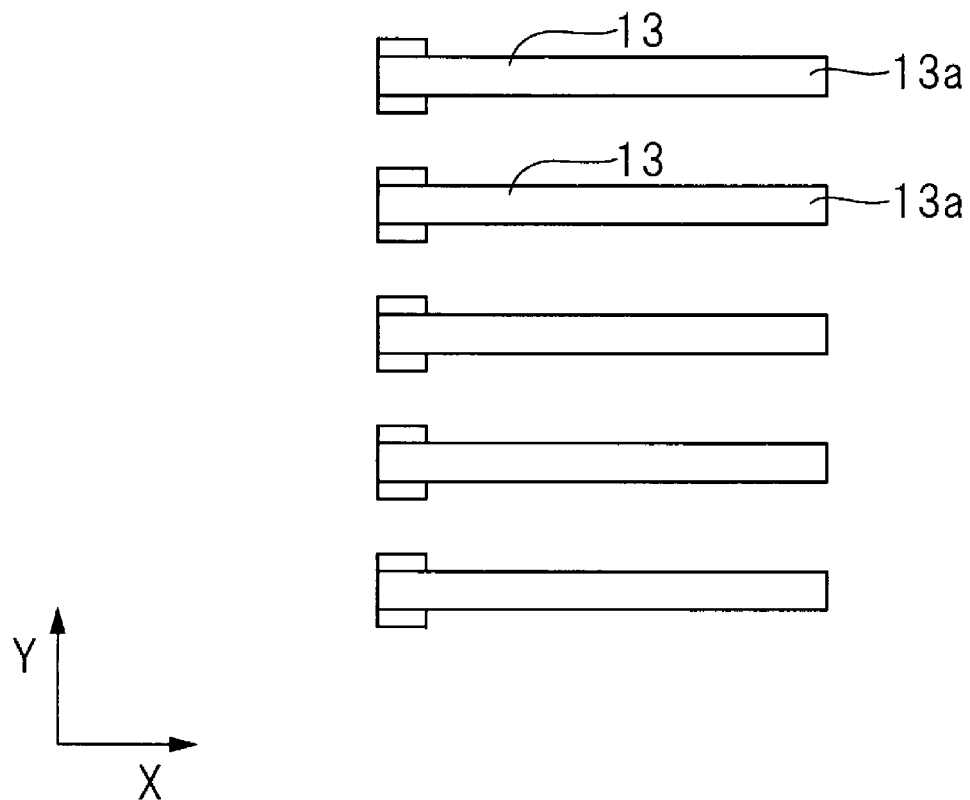

[FIG. 5]
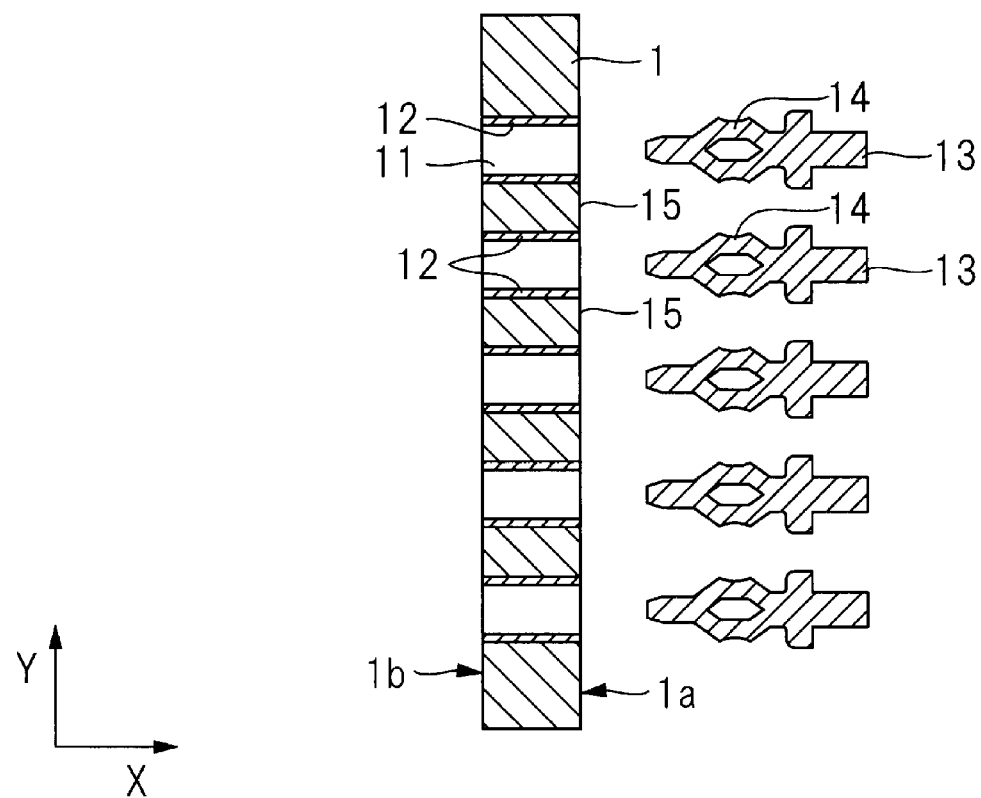

[FIG. 6]
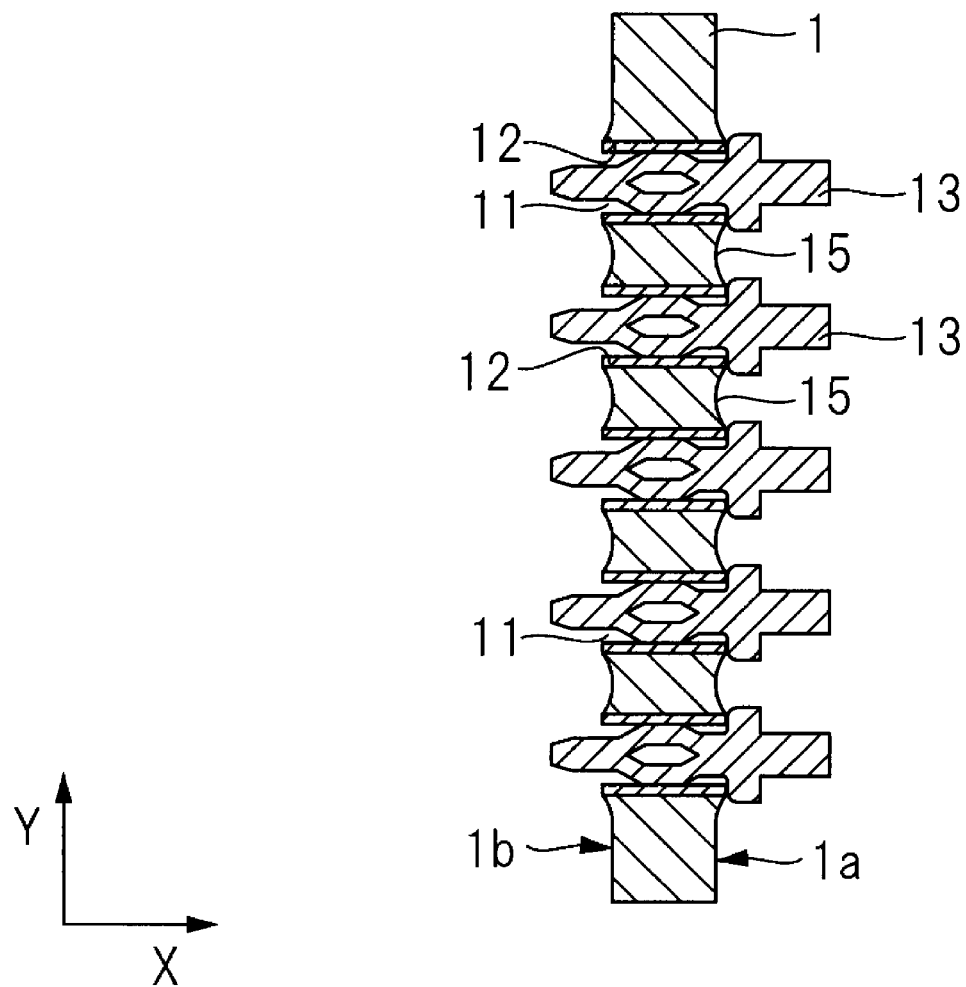

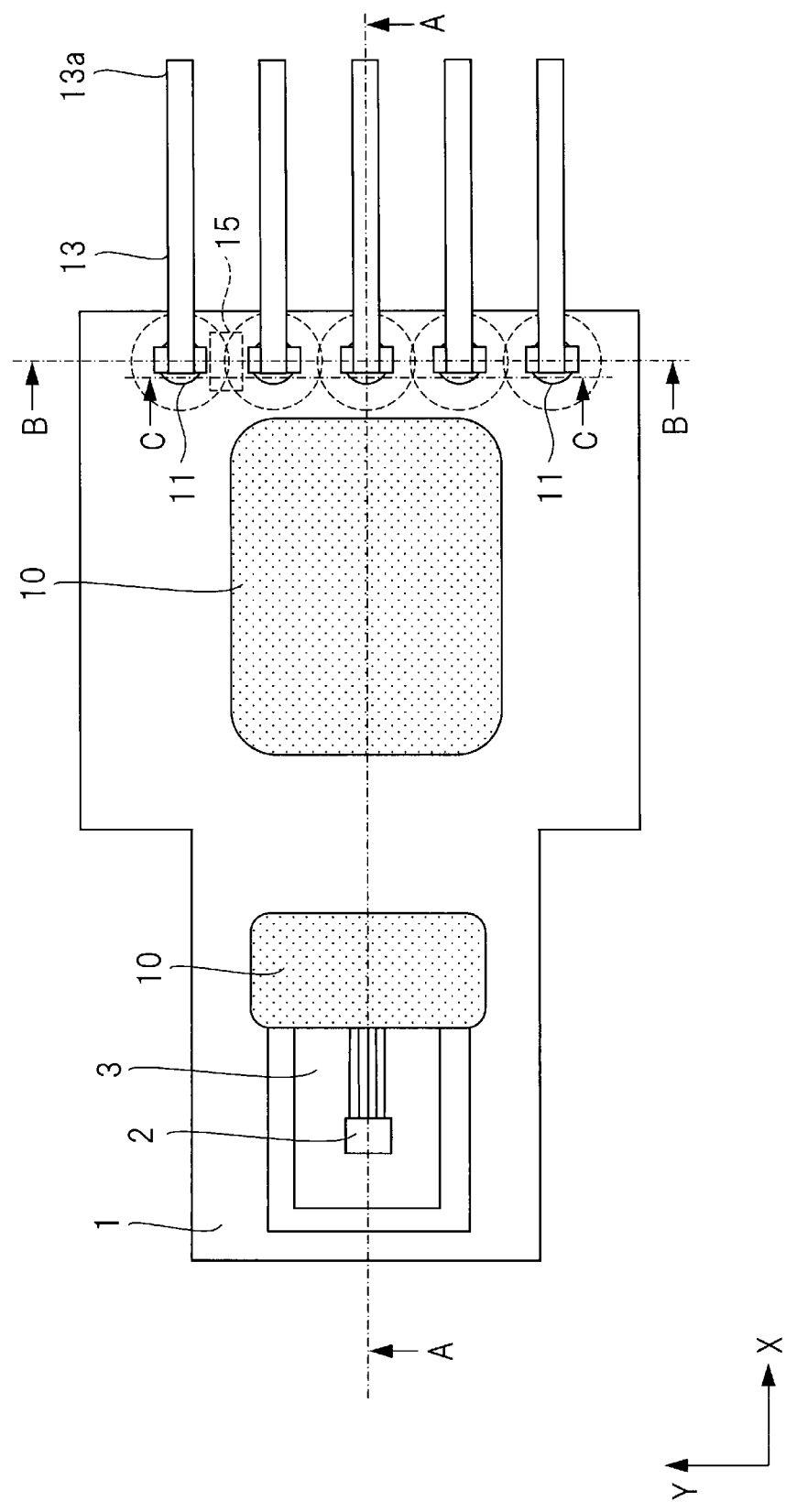
[FIG. 7]

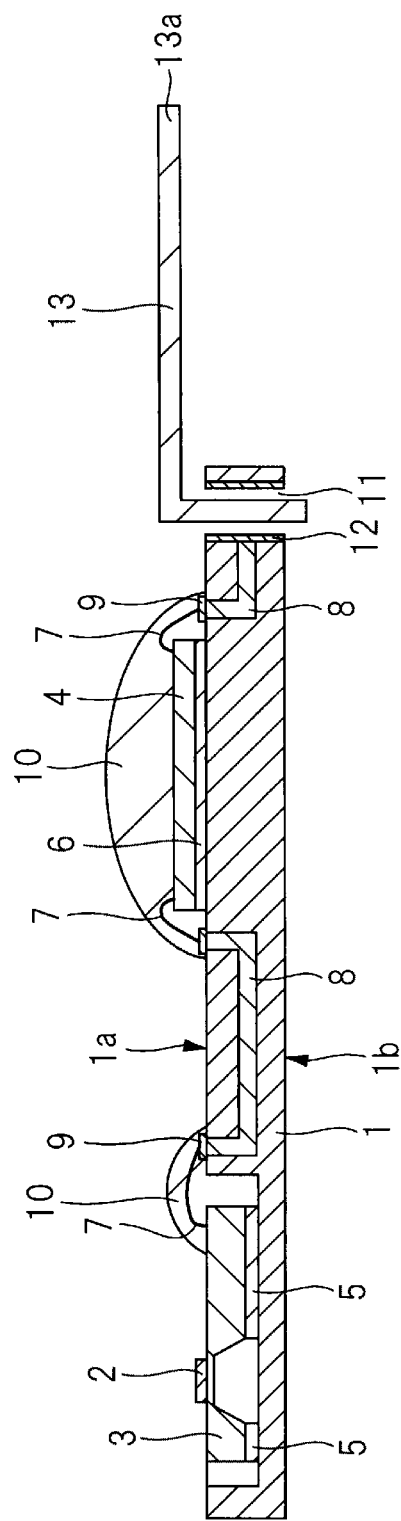
[FIG. 8]

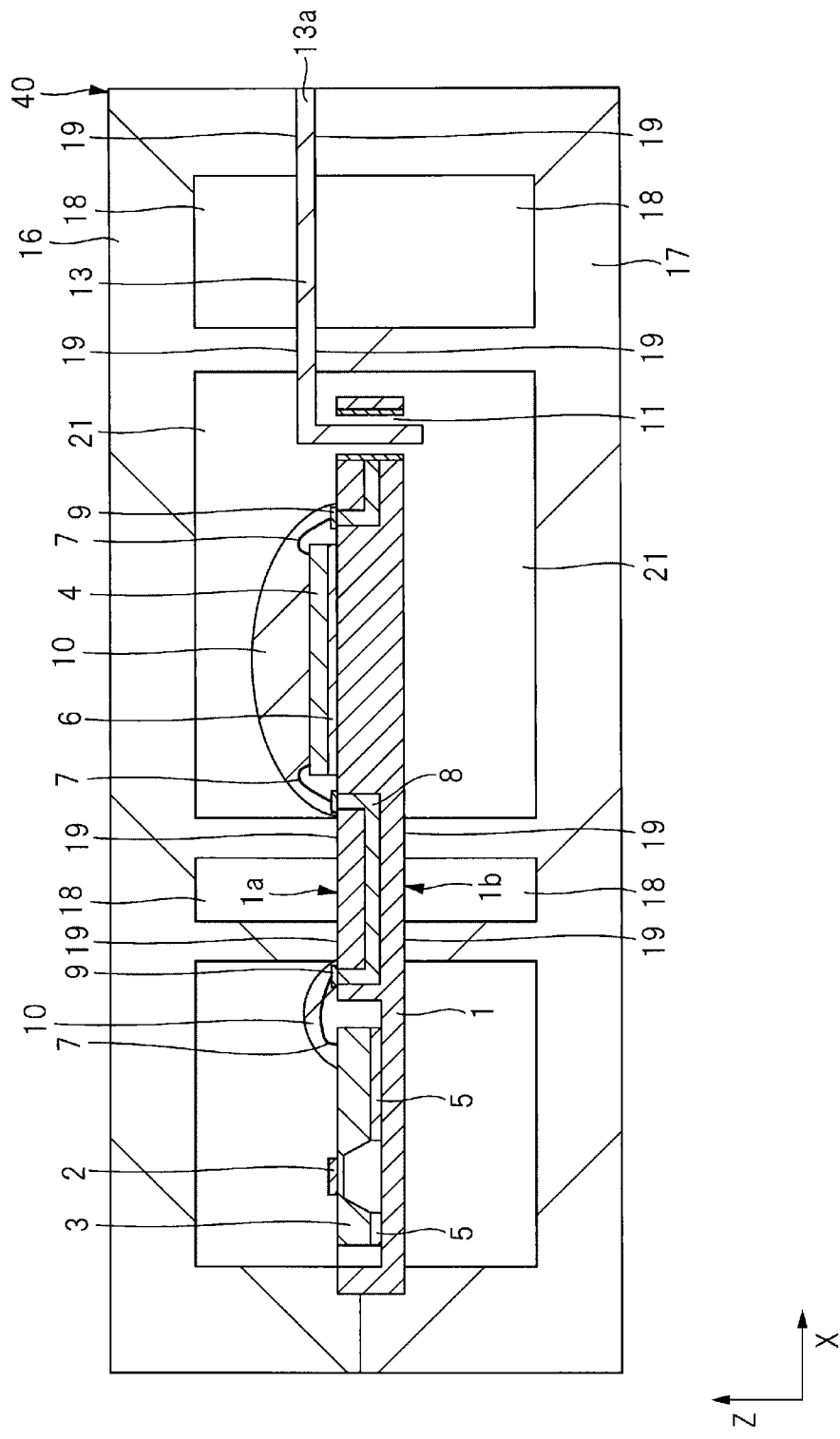
[FIG. 9]

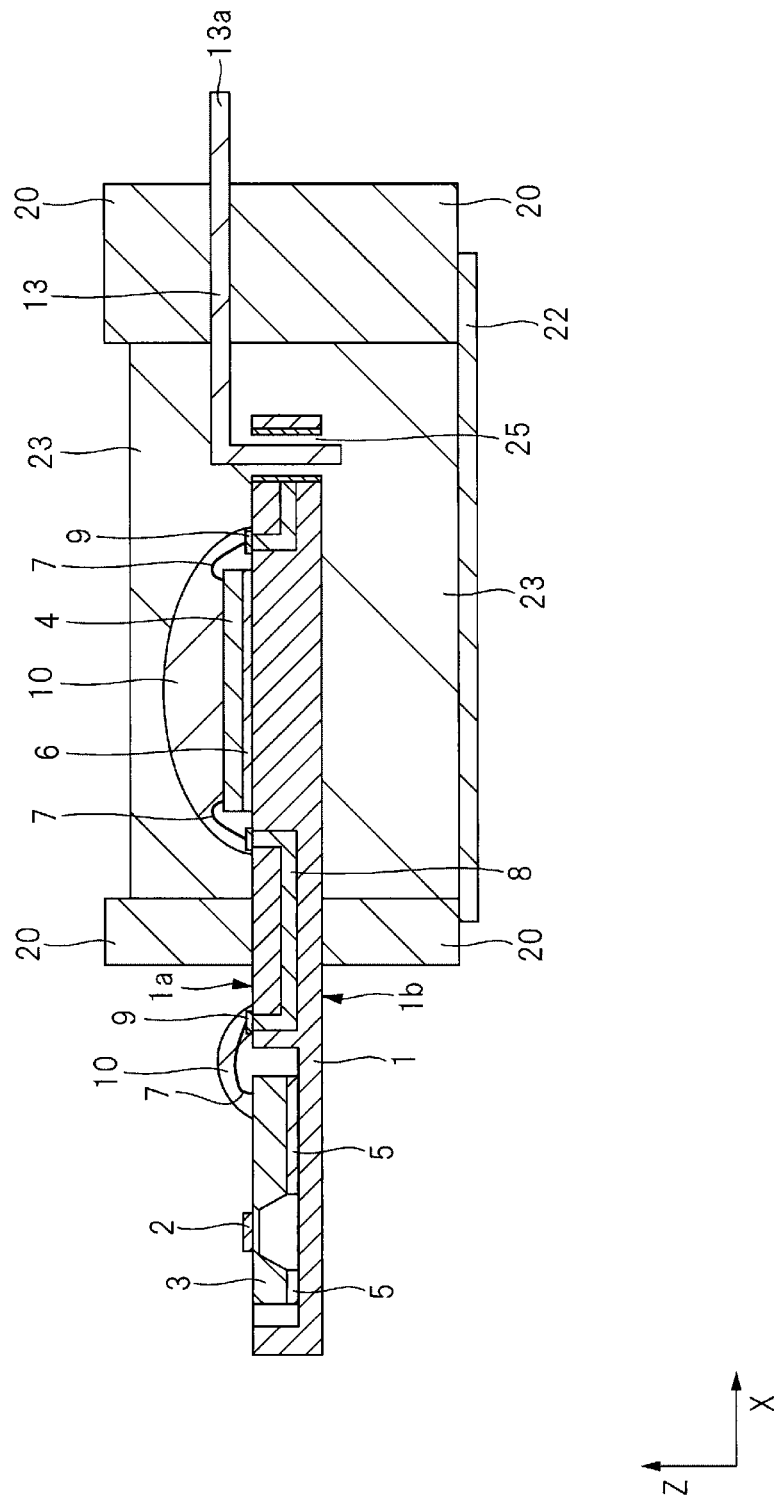
[FIG. 10]

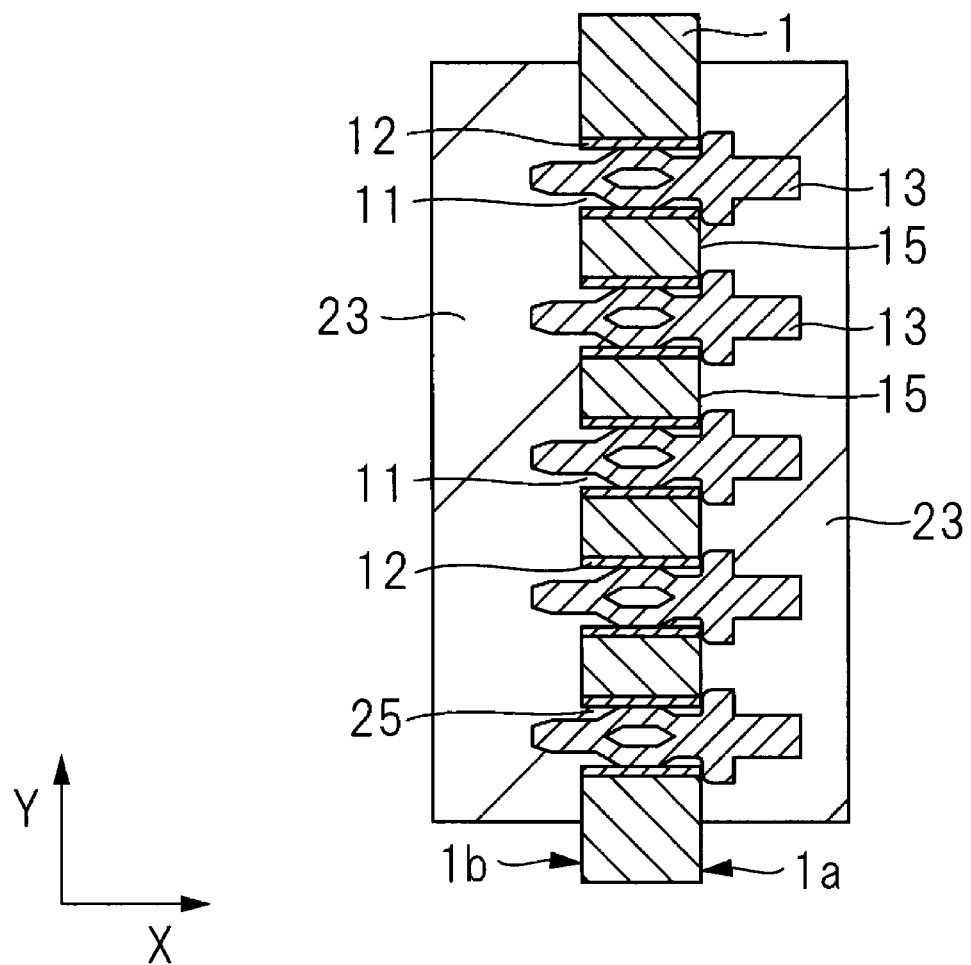
[FIG. 11]

[FIG. 12]
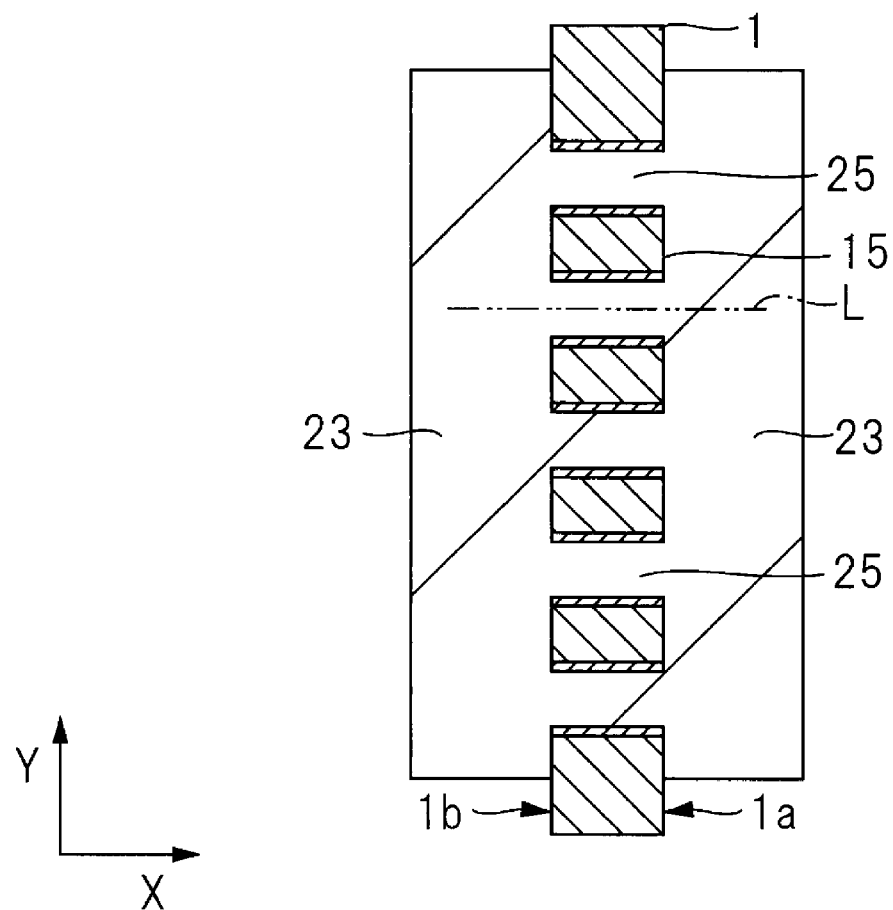

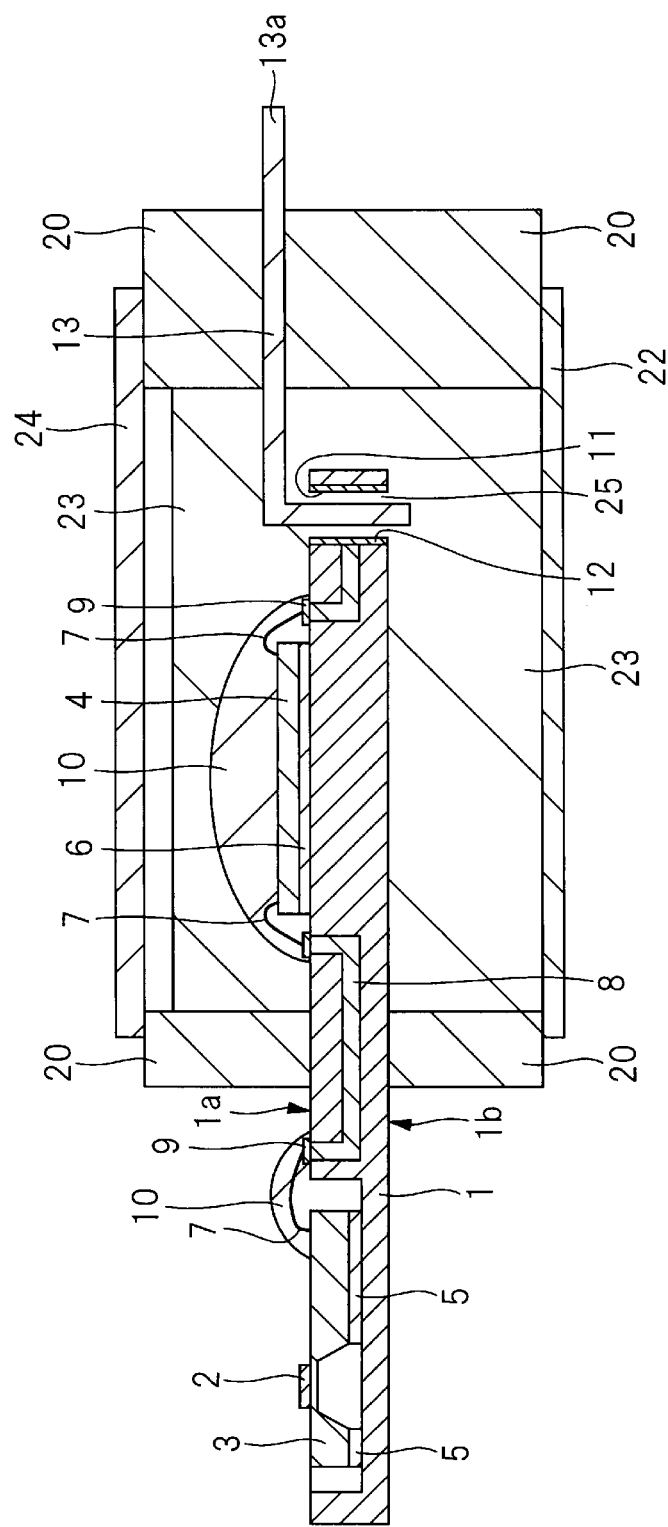
[FIG. 13]

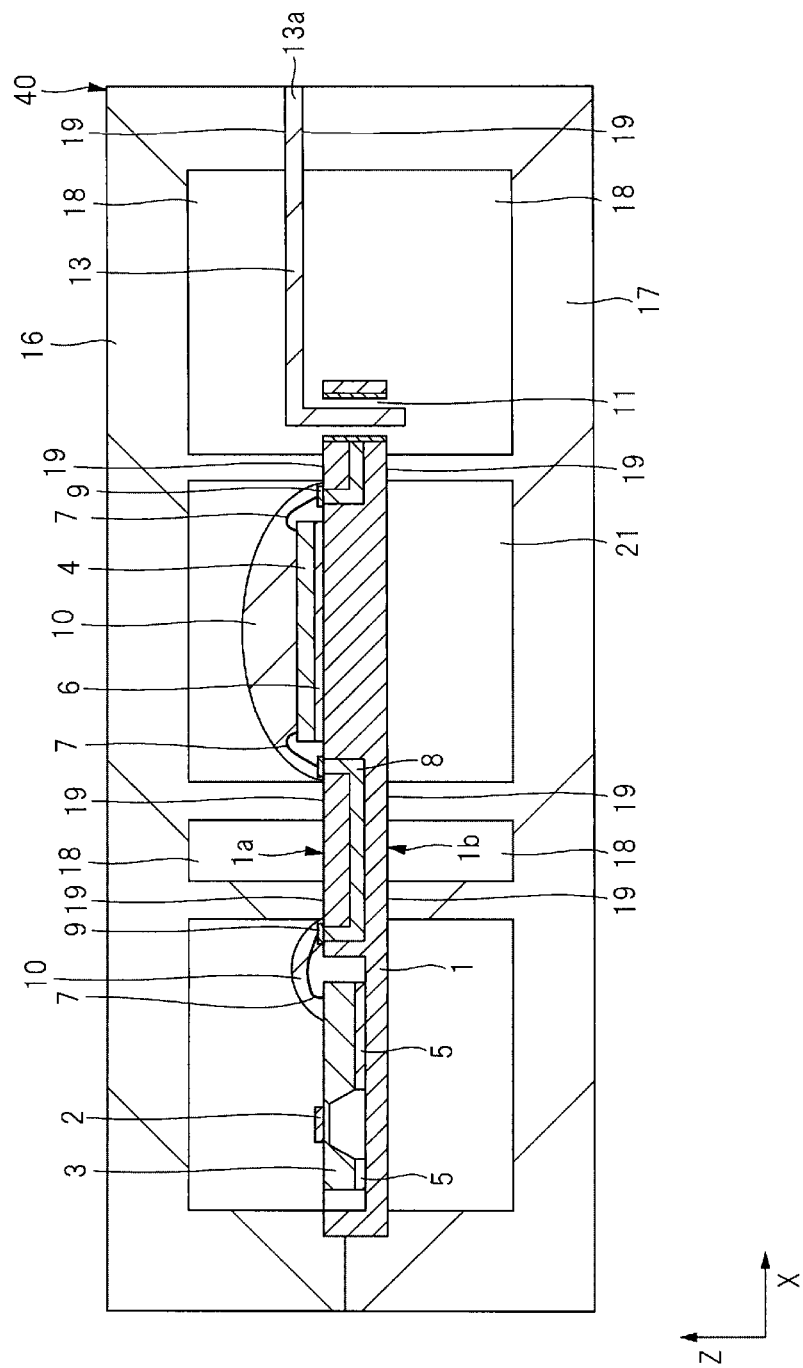
[FIG. 14]

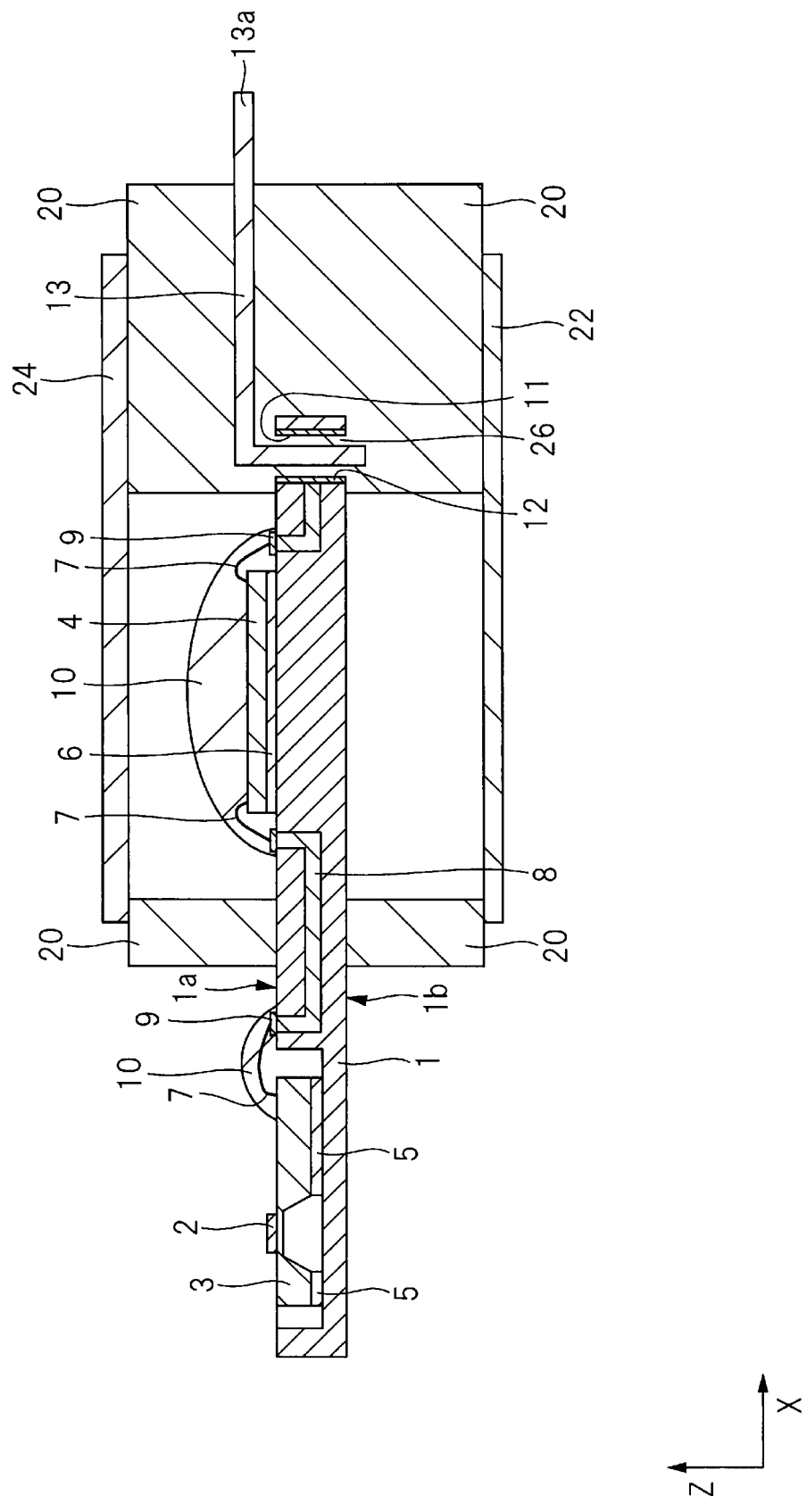
[FIG. 15]

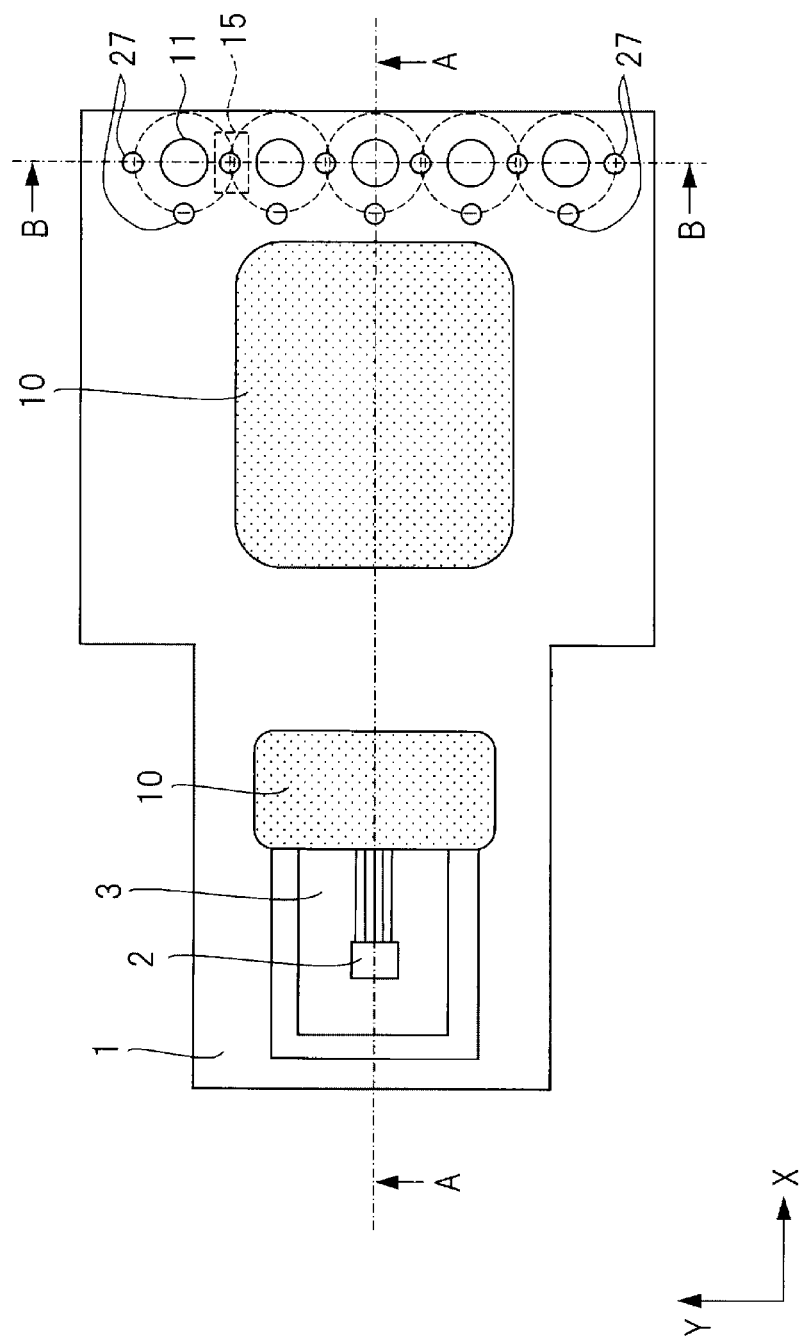
[FIG. 16]

[FIG. 17]
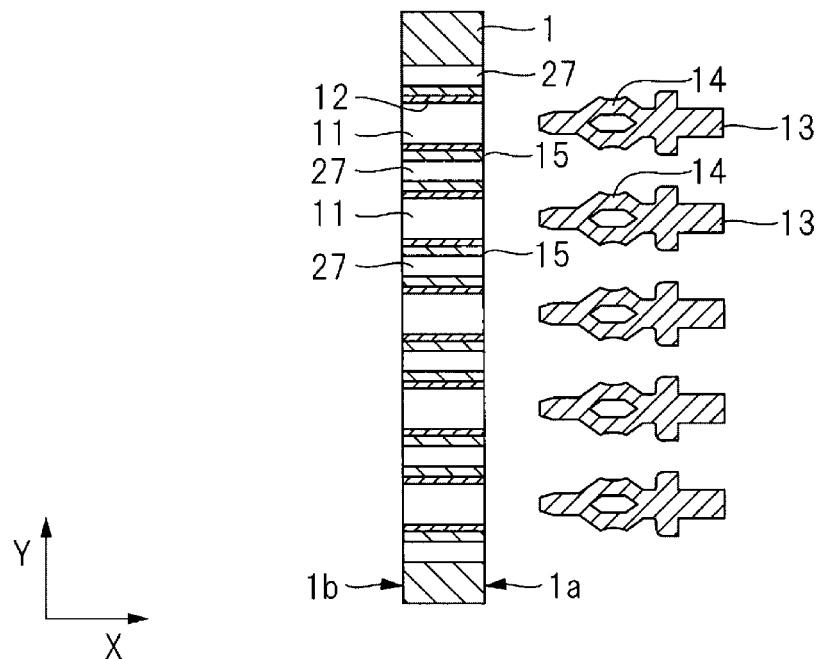
[FIG. 18]
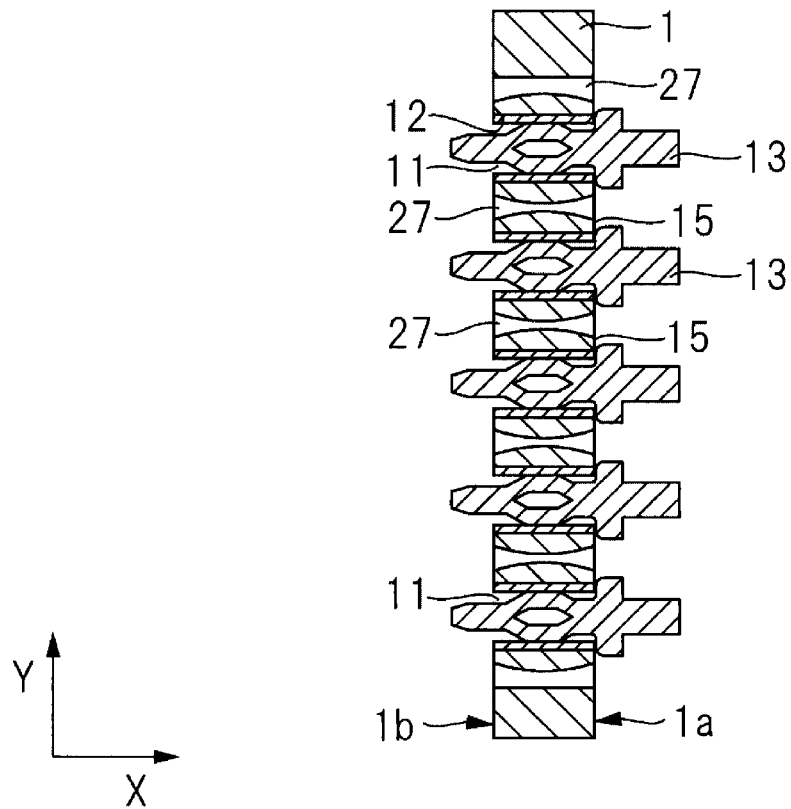

[FIG. 19]
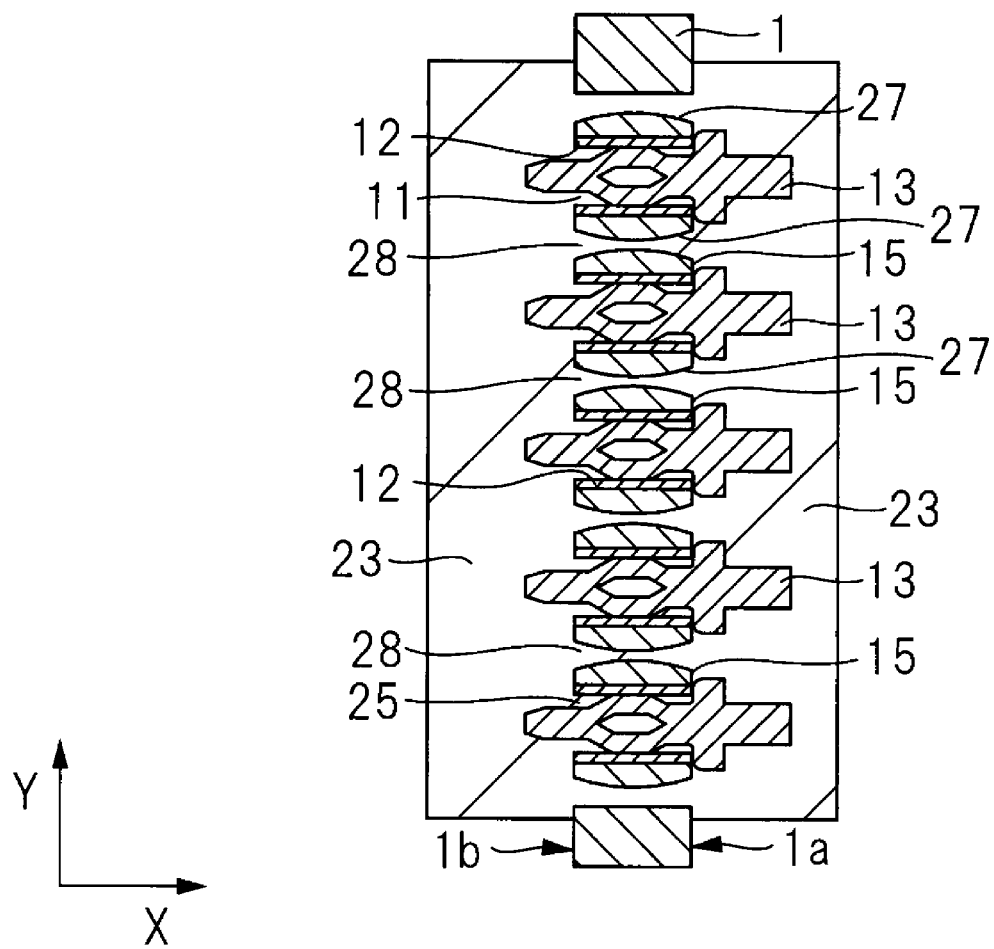

[FIG. 20]
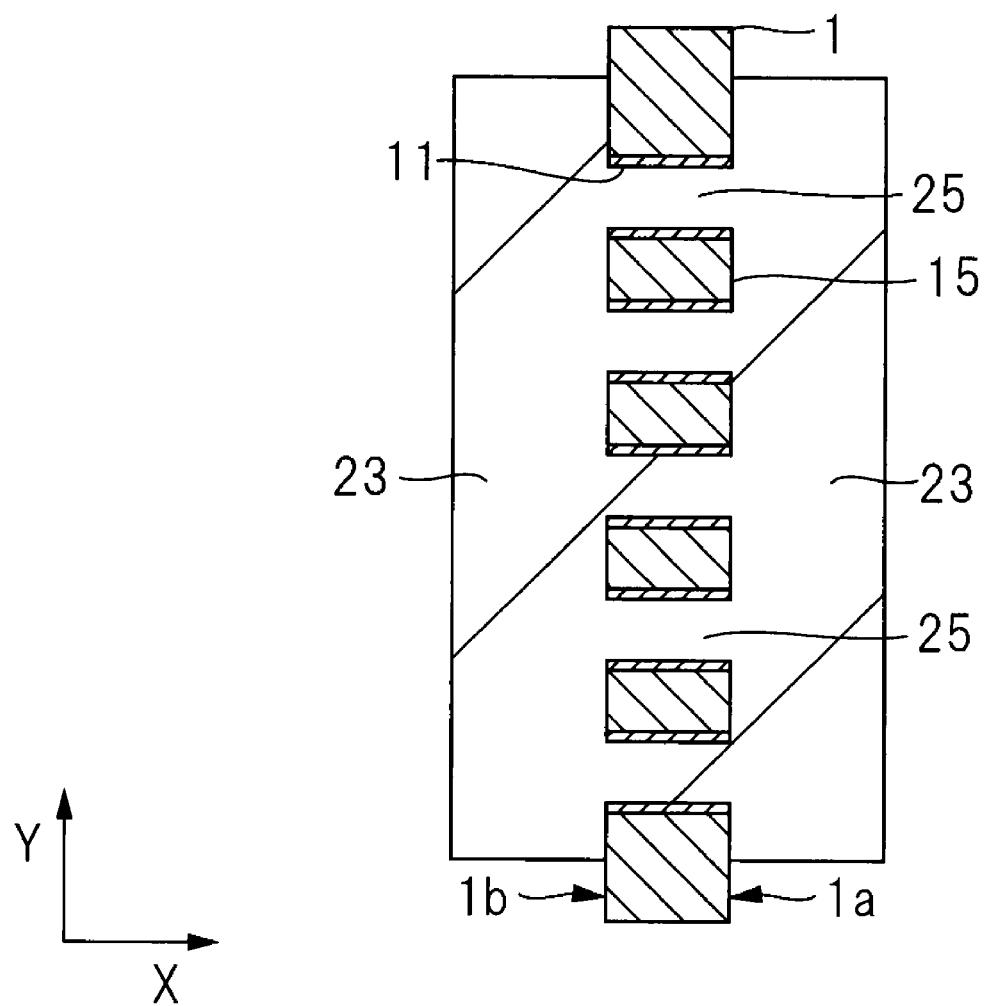

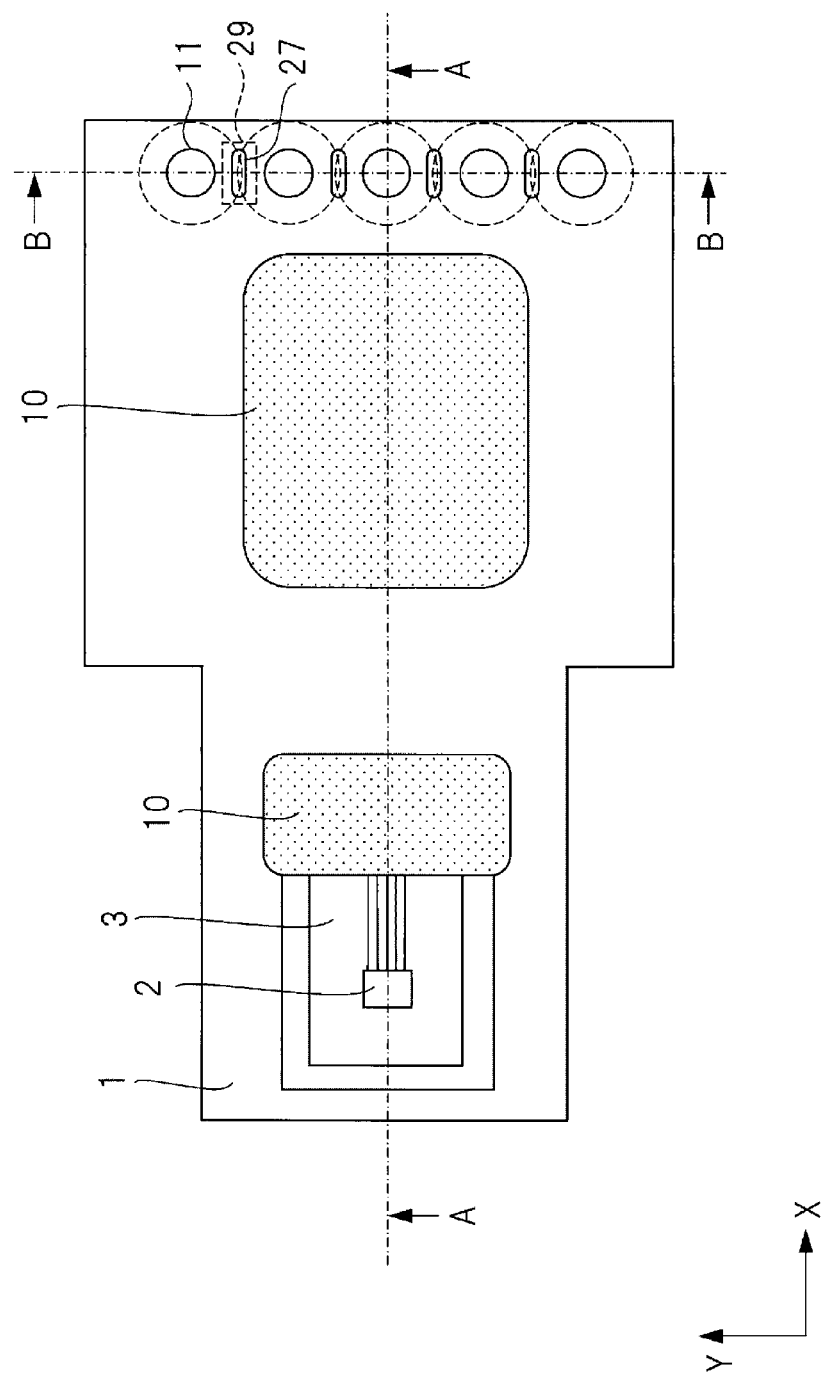
[FIG. 21]

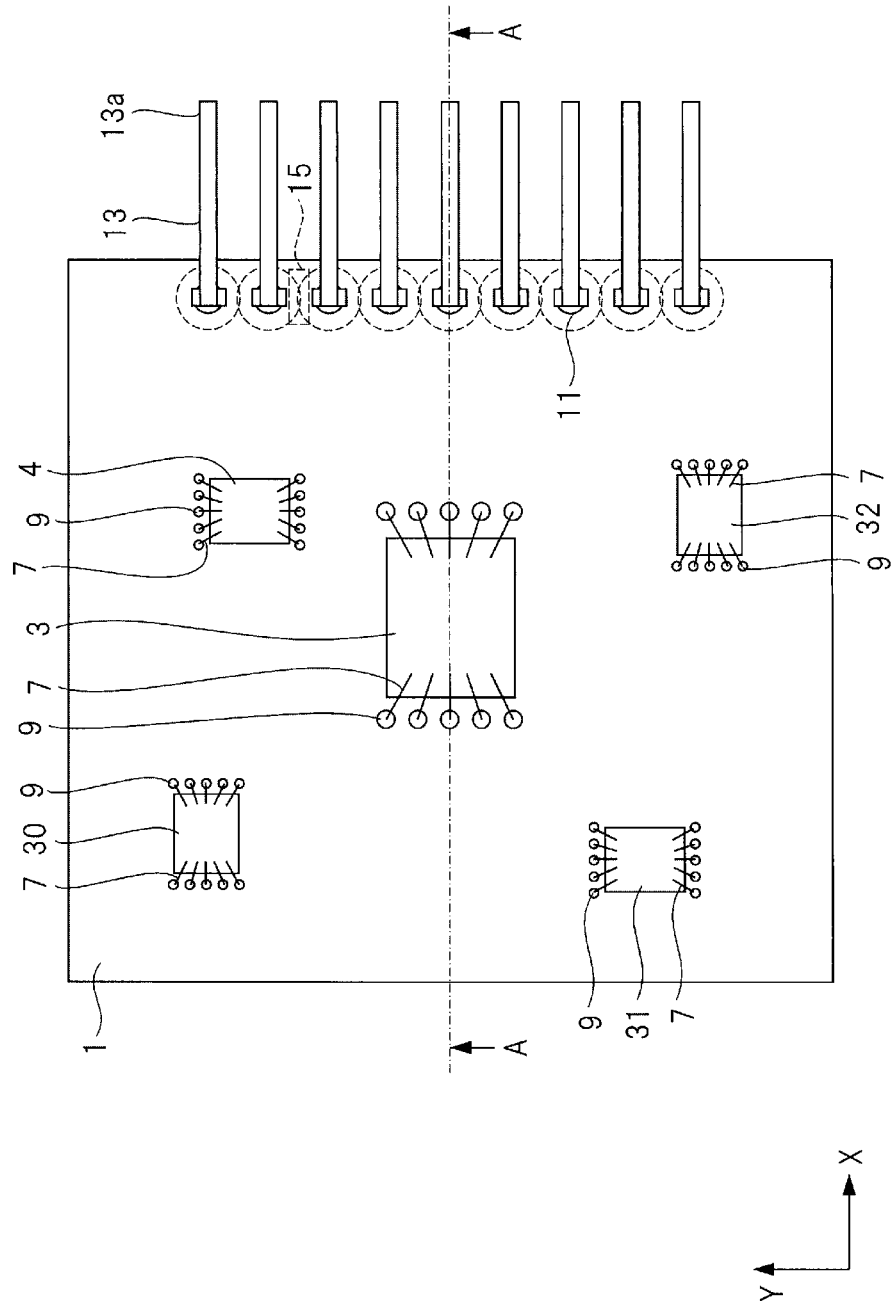
[FIG. 22]

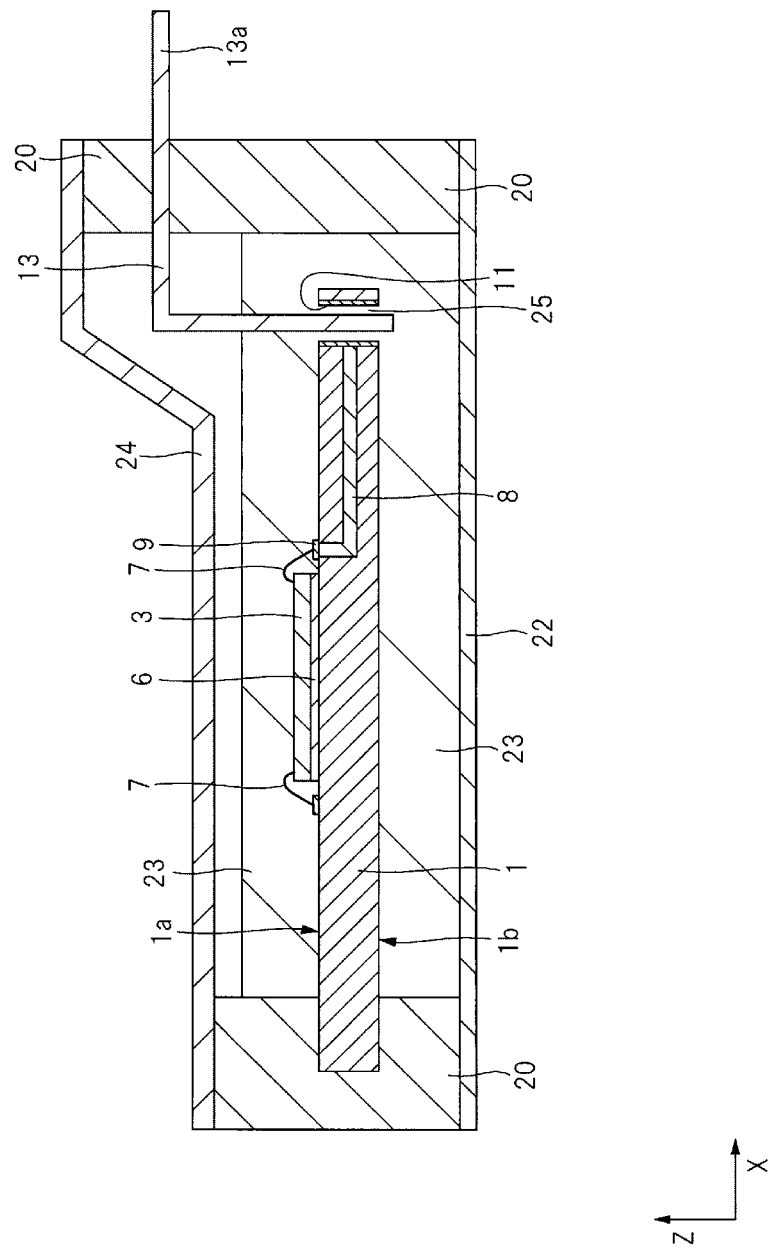
[FIG. 23]

[FIG. 24]
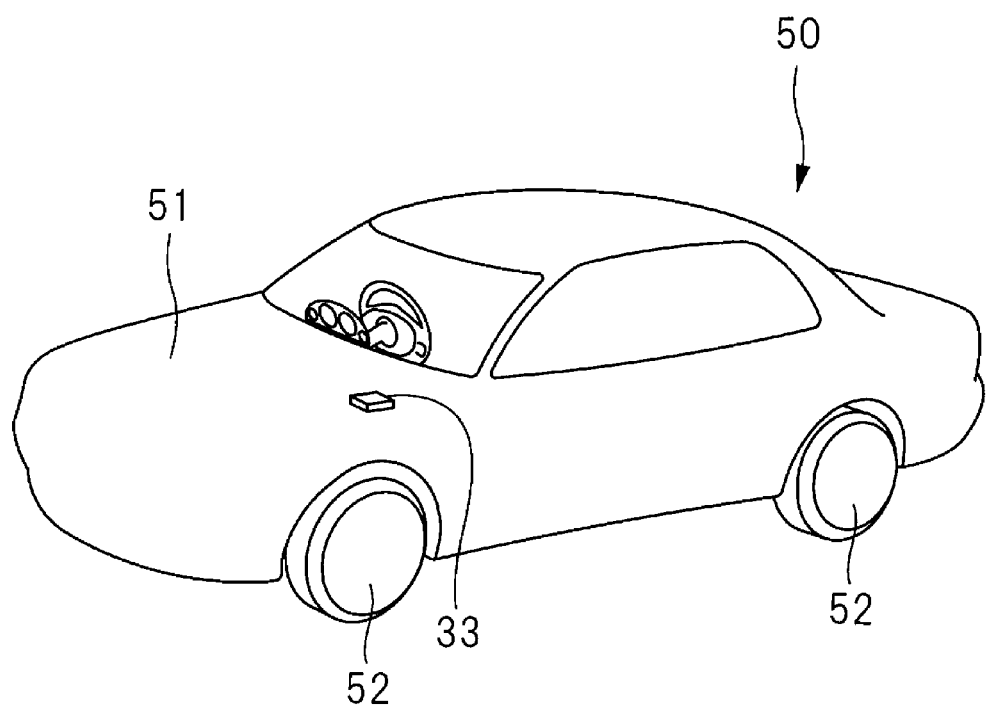

SEMICONDUCTOR MODULE

TECHNICAL FIELD

The present invention relates to a semiconductor module that includes a circuit board on which a press-fit terminal is mounted.

BACKGROUND ART

JP-A-2015-126614 (PTL 1) is known as a module structure that includes a substrate on which a press-fit terminal (also referred to as a press-fit pin) is mounted. PTL 1 discloses a structure in which an interior wall portion that is fixed to a base end portion of a connector terminal (the press-fit terminal) is integrally formed with a mold resin as a part of an exterior case at an interior portion of a fitting space of a connector housing.

Japanese Patent No. 5117282 (PTL 2) discloses a structure in which a press-fit pin is inserted into a through hole that is provided on a wiring substrate, and a module in an electronic device and separated from the wiring substrate is electrically connected to the wiring substrate via the press-fit pin.

PRIOR ART LITERATURE

Patent Literature

PTL 1: JP-A-2015-126614
PTL 2: Japanese Patent No. 5117282

SUMMARY OF INVENTION

Technical Problem

Currently, an internal combustion engine of an automobile and the like is equipped with a sensor module or a module (a semiconductor module) that includes an electronic circuit such as an electronic control device. In these modules, a circuit board equipped with a semiconductor component is used, the circuit board is accommodated in a housing, and a conductor terminal (for example, a press-fit terminal) is used for signal input and output with the outside.

For example, in a connection using the press-fit terminal, an elastically deformable elastic deformation region is formed in the press-fit terminal, and the elastic deformation region is press-fitted into a through hole that is formed on a circuit board to achieve an electrical connection. Further, in the connection using the press-fit terminal, when the elastic deformation region of the press-fit terminal is press-fitted into the through hole, the elastic deformation region is deformed by forming a region in which a dimension of the through hole is smaller than a dimension of the press-fit terminal to perform the electrical connection.

However, when a dimensional difference is too large, a load on the circuit board becomes excessive, and the circuit substrate may be deformed due to deterioration at the time of press-fitting or deterioration with time after the press-fitting.

An object of the invention is to provide a technology capable of improving the reliability of a semiconductor module by suppressing a deformation of a circuit board in the semiconductor module using a press-fit terminal.

The above and new features of the invention will become apparent from the description of this specification and the accompanying drawings.

Solution to Problem

The typical ones of the embodiments disclosed in the present application will be briefly described as follows.

A semiconductor module according to one embodiment includes: a semiconductor component; a circuit board that has a first surface on which the semiconductor component is mounted and a second surface opposite to the first surface, and includes a first through hole in which a conductor portion is formed; a connecting conductor member that is press-fitted into the first through hole of the circuit board; and a resin portion that is disposed on the first surface side and the second surface side of the circuit board. Further, the connecting conductor member includes a pressure contact portion that is electrically connected to the conductor portion in the first through hole, and the resin portion on the first surface side of the circuit board and the resin portion on the second surface side of the circuit board are integrally formed via a resin filled in the first through hole.

Advantageous Effect

Effects obtained by typical ones of the inventions disclosed in the present application will be briefly described as follows.

In the semiconductor module that includes the circuit board on which the press-fit terminal is mounted, deformations of the circuit board can be suppressed to improve the reliability of the semiconductor module.

BRIEF DESCRIPTION OF DRAWINGS

FIG. 1 is a plan view showing a mounting structure of a circuit module according to a first embodiment of the invention.

FIG. 2 is a cross-sectional view showing a structure taken along a line A-A shown in FIG. 1.

FIG. 3 is a front view showing a structure of an elastic deformation portion of a press-fit terminal that is mounted on the circuit module shown in FIG. 1.

FIG. 4 is a plan view showing a structure of an exposed portion side of the press-fit terminal that is mounted on the circuit module shown in FIG. 1.

FIG. 5 is a cross-sectional view before a press-fit terminal connection showing a press-fitting state of the press-fit terminal shown in FIG. 3 taken along a line B-B shown in FIG. 1.

FIG. 6 is a cross-sectional view after the press-fit terminal connection showing a press-fitting state of the press-fit terminal shown in FIG. 3 taken along the line B-B shown in FIG. 1.

FIG. 7 is a plan view showing a structure of the circuit module on which the press-fit terminal is mounted according to the first embodiment of the invention.

FIG. 8 is a cross-sectional view showing a structure taken along a line A-A shown in FIG. 7.

FIG. 9 is a cross-sectional view showing a die structure that forms a housing of the circuit module according to the first embodiment of the invention.

FIG. 10 is a cross-sectional view showing a structure in which a press-fit connection portion of the circuit module is covered with a resin according to the first embodiment of the invention.

FIG. 11 is a cross-sectional view corresponding to a structure taken along a line B-B in FIG. 7 in a semiconductor module according to the first embodiment of the invention.

FIG. 12 is a cross-sectional view corresponding to a structure taken along a line C-C in FIG. 7 in the semiconductor module according to the first embodiment of the invention.

FIG. 13 is a cross-sectional view showing a structure of the semiconductor module according to the first embodiment of the invention.

FIG. 14 is a cross-sectional view showing a die structure that forms a housing of a circuit module according to a second embodiment of the invention.

FIG. 15 is a cross-sectional view showing a structure of a semiconductor module according to the second embodiment of the invention.

FIG. 16 is a plan view showing a mounting structure of a circuit module according to a third embodiment of the invention.

FIG. 17 is a cross-sectional view before a press-fit terminal connection showing a press-fitting state of a press-fit terminal taken along a line B-B shown in FIG. 16 according to the third embodiment of the invention.

FIG. 18 is a cross-sectional view after the press-fit terminal connection showing a press-fitting state of the press-fit terminal taken along the line B-B shown in FIG. 16 according to the third embodiment of the invention.

FIG. 19 is a cross-sectional view corresponding to a structure taken along the line B-B in FIG. 7 in a semiconductor module according to the third embodiment of the invention.

FIG. 20 is a cross-sectional view corresponding to a structure taken along the line C-C in FIG. 7 in the semiconductor module according to the third embodiment of the invention.

FIG. 21 is a plan view showing another mounting structure of the circuit module according to the third embodiment of the invention.

FIG. 22 is a plan view showing a mounting structure of a circuit module according to a fourth embodiment of the invention.

FIG. 23 is a cross-sectional view of an electronic control device (a semiconductor module) corresponding to a structure taken along a line A-A shown in FIG. 22.

FIG. 24 is a perspective view showing a structure of an automobile equipped with a unit on which the electronic control device shown in FIG. 23 is mounted.

DESCRIPTION OF EMBODIMENTS

First Embodiment

An internal combustion engine of an automobile and the like is equipped with a semiconductor module such as a sensor module or a semiconductor module that includes an electronic circuit such as an electronic control device. In these semiconductor modules, a circuit board equipped with a semiconductor component is used. In addition, the circuit board is accommodated in a housing, and a conductor terminal is used for signal input and output with the outside. Further, a press-fit terminal (also referred to as a press-fit pin) is known as the conductor terminal.

Further, in a press-fit connection using the press-fit terminal, an elastically deformable elastic deformation region is formed in advance in the press-fit terminal, and the elastic deformation region is press-fitted into a through hole formed on the circuit board with a conductor foil being formed inside the through hole, so as to achieve an electrical connection. Then, in the press-fit connection, since the circuit board and the press-fit terminal are connected without using an intermediate member such as a wire, the number of components can be reduced.

Although a sensor chip that detects a physical quantity such as a flow rate, humidity, and an acceleration is mounted on the semiconductor module such as the sensor module, in the following first embodiment, an intake air amount sensor (a flow sensor) mounted on an internal combustion engine of an automobile is taken as an example of the press-fit connection, and a technology of improving the reliability of the intake air amount sensor by suppressing the deformation of the circuit board incorporated in the intake air amount sensor will be described.

The intake air amount sensor (the semiconductor module) is the flow sensor that measures a flow rate of gas (air), and is installed for use in controlling intake air amount by an electronic control fuel injection device that is mounted on the internal combustion engine. A sensor chip which has a thin diaphragm is used in the intake air amount sensor, and measurement data in the sensor chip is collected and corrected by a control chip, and is output to the outside.

Hereinafter, the intake air amount sensor which is the semiconductor module according to the first embodiment will be described with reference to the drawings.

FIG. 1 is a plan view showing a mounting structure of a circuit module according to the first embodiment of the invention, and FIG. 2 is a cross-sectional view showing a structure taken along a line A-A shown in FIG. 1.

The circuit module shown in FIG. 2 is incorporated in the intake air amount sensor, in which, for example, a first semiconductor chip 3 which has a diaphragm 2 and serves as a sensor chip that senses a flow rate, and a second semiconductor chip 4 which has a control circuit that controls the first semiconductor chip 3 are mounted on a circuit board 1 that is formed of a base material including a glass fiber and a resin. The circuit board 1 and the first semiconductor chip 3 are assembled by a first adhesive 5, and the circuit board 1 and the second semiconductor chip 4 are assembled by a second adhesive 6.

An inner layer conductor wiring 8 and a wiring pad 9 of the inner layer conductor wiring 8 are formed in the circuit board 1, and the first semiconductor chip 3 and the second semiconductor chip 4 are electrically connected via a wire 7, the inner layer conductor wiring 8 and the wiring pad 9. Further, the second semiconductor chip 4 is electrically connected to a conductor foil 12 of a first through hole 11 via the wire 7, the wiring pad 9, and the inner layer conductor wiring 8. Further, potting portion 10 that protects the wire 7 and a potting portion 10 that protects the wire 7 and the second semiconductor chip 4 are disposed on a surface 1a of the circuit board 1. A resin that forms the potting portion 10 is another resin different from a first resin 20 described later.

Further, the first through hole 11 used for ensuring an electrical connection with the outside is formed on the circuit board 1, and the conductor foil (a conductor portion) 12 connected to the inner layer conductor wiring 8 is formed on an inner wall which is an inner surface of the first through hole 11.

For example, a thermosetting resin such as an epoxy resin and a polyurethane resin or a thermoplastic resin such as a polyimide resin and an acrylic resin can be used as the first adhesive 5 that adheres the circuit board 1 and the first semiconductor chip 3, the second adhesive 6 that adheres the circuit board 1 and the second semiconductor chip 4, and the resin (another resin) that forms the potting portion 10 protecting the wire 7. Further, a resin in which a filler such as a glass or a mica is mixed may be used.

Here, the structure of the intake air amount sensor in which the circuit module is incorporated according to the first embodiment will be described. The intake air amount sensor (the semiconductor module) according to the first embodiment shown in FIG. 13 described later includes semiconductor components such as the first semiconductor chip 3 and the second semiconductor chip 4. The intake air amount sensor further includes the circuit board 1 which includes a surface (a first surface) 1a on which these semiconductor components are mounted, a back surface (a second surface) 1b opposite to the surface 1a, and the first through hole 11 in which the conductor foil (the conductor portion) 12 is formed. In addition, the intake air amount sensor includes a press-fit terminal (a connecting conductor member) 13 which is a conductor terminal that is electrically connected to the conductor foil 12 in the first through hole 11 of the circuit board 1, and a second resin 23 which is a resin portion that is disposed on the surface 1a side and the back surface 1b side of the circuit board 1.

Further, the press-fit terminal (the connecting conductor member) 13 includes an elastic deformation portion (a pressure contact portion) 14 shown in FIG. 3 which is inserted (press-fitted) into the first through hole 11 and electrically connected to the conductor foil 12 in the first through hole 11. That is, the press-fit terminal 13 is provided with an elastic structure at the pressure contact portion, and due to the elastic structure of the elastic deformation portion 14, the press-fit terminal 13 presses an inner wall of the first through hole 11 to contact with the conductor foil (the conductor portion) 12 formed on the inner wall (achieve electrical continuity).

Further, in the intake air amount sensor, the second resin 23 which is the resin portion disposed on the surface 1a side of the circuit board 1 and the second resin 23 which is the resin portion disposed on the back surface 1b side of the circuit board 1 are integrally formed via a second resin 25 which is a resin filled in the first through hole 11. That is, the second resin 23 on the surface 1a side, the second resin 23 on the back surface 1b side, and the second resin 25 filled in the first through hole 11 are integrally formed in a connected state.

Further, in the intake air amount sensor, the first resin 20 is formed as a housing of the circuit module so as to surround the second resin 23. In other words, the second resin 23 is formed in a region inside the first resin 20 formed as the housing, and in the region inside the first resin 20, the second resin 23 on the surface 1a side and the second resin 23 on the back surface 1b side are integrally formed via the second resin 25 filled in the first through hole 11.

Further, an upper cover 24 that covers the second resin 23 on the surface 1a side of the circuit board 1 and a lower cover 22 that covers the second resin 23 on the back surface 1b side of the circuit board 1 are bonded to the first resin 20 which is the housing.

One end portion of the press-fit terminal 13 is disposed in the first through hole 11, and the other end portion opposite to the one end portion of the press-fit terminal 13 is exposed to the outside of the first resin 20. The portion of the press-fit terminal 13 exposed to the outside is an external terminal of the intake air amount sensor. That is, the press-fit terminal 13 is formed in an L-shape, and the elastic deformation portion 14 which is the pressure contact portion is formed at one end portion of the press-fit terminal 13, and is inserted (press-fitted) into the first through hole 11 of the circuit board 1. Further, an exposed portion 13a of the other end portion which is bent at a substantially right angle to an extending direction of the elastic deformation portion 14 and extends is exposed to the outside of the first resin 20 as the external terminal.

Next, a manufacturing method of electrically connecting the circuit module and the press-fit terminal 13 using a press-fit connection for the mounting structure of the circuit module shown in FIG. 1 and FIG. 2 will be described.

FIG. 3 is a plan view showing a structure of the elastic deformation portion of the press-fit terminal that is mounted on the circuit module shown in FIG. 1, and FIG. 4 is a plan view showing a structure of the exposed portion side of the press-fit terminal that is mounted on the circuit module shown in FIG. 1. Further, FIG. 5 is a cross-sectional view before a press-fit terminal connection showing a press-fitting state of the press-fit terminal shown in FIG. 3 taken along a line B-B shown in FIG. 1, and FIG. 6 is a cross-sectional view after the press-fit terminal connection showing a press-fitting state of the press-fit terminal shown in FIG. 3 taken along the line B-B shown in FIG. 1.

As shown in FIG. 3, the elastic deformation portion 14 is formed in the press-fit terminal 13. The elastic deformation portion 14 according to the first embodiment has a mechanism that elastically deforms in an arrangement direction (the Y direction) of the press-fit terminals 13. Further, the press-fit terminal 13 has the exposed portion 13a serving as the external terminal as shown in FIG. 4 at the end portion opposite to the end portion provided with the elastic deformation portion 14.

As shown in FIG. 5 and FIG. 6, the elastic deformation portion 14 of the press-fit terminal 13 is deformed when being press-fitted into the first through hole 11. At this time, a load is transmitted from the elastic deformation portion 14 in a Y-axis direction (a width direction) of the circuit board 1, so that an inter-hole portion 15 which is a region between the adjacent first through-holes 11 is particularly easily deformed in a Z-axis direction (a thickness direction) as shown in FIG. 6. That is, a load is applied to the inter-hole portion 15 from the first through holes 11 on both sides by the elastic deformation portion 14 of the press-fit terminal 13, so that the deformation tends to occur.

Here, FIG. 7 is a plan view showing a structure of the circuit module on which the press-fit terminal is mounted according to the first embodiment of the invention, and FIG. 8 is a cross-sectional view showing a structure taken along a line A-A shown in FIG. 7.

As shown in FIG. 7 and FIG. 8, a plurality of first through holes 11 are arranged in a row on the circuit board 1 of the circuit module, and the elastic deformation portions 14 of the press-fit terminals 13 shown in FIG. 5 are inserted (press-fitted) into the respective first through holes 11. As the press-fit terminal 13, it is possible to use a material, for example, a metal such as copper, iron and lead, or resins or ceramics mixed with conductive fine particles that has conductivity as a whole, or a member in which a conductive metal such as gold, nickel, zinc is plated on a surface of an insulating member.

Next, FIG. 9 is a cross-sectional view showing a die structure that forms the housing of the circuit module according to the first embodiment of the invention, FIG. 10 is a cross-sectional view showing a structure in which the press-fit connection portion of the circuit module is covered with the resin according to the first embodiment of the invention, and FIG. 11 is a cross-sectional view corresponding to a structure taken along a line B-B in FIG. 7 in a semiconductor module according to the first embodiment of the invention. Further, FIG. 12 is a cross-sectional view corresponding to a structure taken along a line C-C in FIG.

7 in the semiconductor module according to the first embodiment of the invention, and FIG. 13 is a cross-sectional view showing a structure of the semiconductor module according to the first embodiment of the invention.

As shown in FIG. 9, the housing that serves as a case of the circuit module is formed by resin molding using a molding die 40. First, the circuit module on which the press-fit terminal 13 and the like is mounted is disposed on a die surface of the molding die 40 configured by an upper die 16 and a lower die 17, the upper die 16 and the lower die 17 press the circuit module with a clamp portion 19 of the die to form a cavity portion 18, and the cavity portion 18 is filled with the first resin 20 as shown in FIG. 10. That is, the resin molding that forms the housing is insert molding. The housing that serves as the case is formed with the first resin 20 by the resin molding.

After the housing is formed by the resin molding, as shown in FIG. 10, first, the lower cover 22 is bonded to the first resin 20 in order to inject the second resin (the resin portion) 23 into a cavity portion 21 shown in FIG. 9 that includes the press-fit connection portion. Further, after the bonding, the second resin 23 is injected into the cavity portion 21, and therefore, the cavity portion 21 is filled with the second resin 23. At this time, by filling the cavity portion 21 with the second resin 23, each of the plurality of first through holes 11 of the circuit board 1 shown in FIG. 9 is filled with the second resin 25 as shown in FIG. 10.

By filling the second resin 23, the second resin 23 is respectively formed on the surface (the first surface, the main surface) 1a of the circuit board 1 and on the back surface (the second surface) 1b opposite to the surface 1a as shown in FIG. 11 and FIG. 12. Further, the second resin 23 on the surface 1a side and the second resin 23 on the back surface 1b side are linearly connected by the second resin 25 that is embedded in the first through hole 11.

In other words, the second resin 25 that is filled in the first through hole 11 is arranged on a straight line L that connects the second resin 23 on the surface 1a side of the circuit board 1 and the second resin 23 on the back surface 1b side of the circuit board 1. That is, as shown in FIG. 12, the second resin 25 in the first through hole 11 that connects the second resin 23 on the surface 1a side of the circuit board 1 and the second resin 23 on the back surface 1b side of the circuit board 1 has a columnar shape extending linearly without bending.

Accordingly, the rigidity of a beam structure by the second resin 25 in the first through hole 11 can be increased.

After the second resin 23 is filled, as shown in FIG. 13, the upper cover 24 is bonded to the first resin 20, and the semiconductor module (the intake air amount sensor, the sensor module) capable of outputting a detection signal from the circuit module to the outside by the exposed portion 13a of the press-fit terminal 13 is completed.

In the semiconductor module according to the first embodiment shown in FIG. 13, the housing which is formed of the first resin 20 by the resin molding is formed on the surface 1a side and the back surface 1b side of the circuit board 1. Then, the second resin (the resin portion) 23 that is formed in the region inside the housing on the surface 1a side of the circuit board 1 and the second resin (the resin portion) 23 that is formed in the region inside the housing on the back surface 1b side are integrally formed via the second resin 25 that is different from the first resin 20 and filled in the first through hole 11.

Further, for the first resin 20 and the second resin 23 (the second resin 25) of the semiconductor module (the intake air amount sensor, the sensor module), it is possible to use, for example, a thermosetting resin such as an epoxy resin or a phenol resin filled with insulating ceramics or glass, or a thermoplastic resin such as polycarbonate or polyethylene terephthalate.

The hardness of the first resin 20 is preferably larger since the first resin 20 is used as the resin that forms the housing which is the case. That is, the hardness of the first resin 20 is preferably larger than the hardness of the second resin 23 (the second resin 25), so that the rigidity of the housing can be ensured. However, when the hardness of the first resin 20 is large, the press-fit terminal 13 may be deformed during the resin molding. In this case, the second resin 23 which has a lower hardness may be used for the housing, and since the resin molding is performed by using the second resin 23 which has the lower hardness to form the housing, the deformation of the press-fit terminal 13 at the time of resin molding can be suppressed.

That is, the first resin 20 and the second resin 23 (the second resin 25) may be the same resin or may be different resins.

Here, a problem of the press-fit connection studied by an inventor of this application and features of the first embodiment will be described.

In the press-fit connection, it is necessary to press-fit a press-fit terminal which has a dimension larger than a dimension of the through hole in order to maintain the electrical connection. At this time, the maintenance reliability of the connection is improved as the dimensional difference between the press-fit terminal and the through hole becomes greater, but the load on the circuit board due to an elastic force is also increased at the same time, and the substrate may crack.

In the press-fit connection studied by the inventor of this application, since the resin is not filled in the through hole into which the press-fit terminal is inserted, a substrate deformation in the Z-axis direction (a substrate thickness direction) due to excessive load particularly at the inter-hole portion 15 in FIG. 6 cannot be suppressed, and as a result, the substrate may crack.

Therefore, in the semiconductor module (the intake air amount sensor, the sensor module) shown in FIG. 13 according to the first embodiment, each of the plurality of first through holes 11 is filled with the second resin 25 as shown in FIG. 11 and FIG. 12.

Accordingly, in the press-fit connection, even if the inter-hole portion 15 which is the region between the adjacent first through holes 11 in the circuit board 1 is deformed, a restraining force of the circuit board 1 in the substrate thickness direction can be increased by the second resin 25 filled in each of the first through holes 11, and as a result, the deformation in the inter-hole portion 15 of the circuit board 1 can be reduced. Particularly, as shown in FIG. 12, when the second resin 23 on the surface 1a side of the circuit board 1 and the second resin 23 on the back surface 1b side of the circuit board 1 are linearly connected by the second resin 25 in the first through holes 11, the restraining force acts more effectively, which is desirable.

As described above, in the semiconductor module (the intake air amount sensor, the sensor module) according to the first embodiment, the second resin 23 on the surface 1a side of the circuit board 1 and the second resin 23 on the back surface 1b side of the circuit board 1 are integrally connected by the second resin 25 filled in the first through holes 11. Therefore, the second resin 25 in the first through holes 11 serves as a pillar, and the inter-hole portions 15 in the circuit board 1 can be pressed by the second resin 23 disposed above and below, and the restraining force from the above and the below in the inter-hole portion 15 can be increased.

Accordingly, a damage such as peeling of the substrate in the inter-hole portions 15 in the circuit board 1 can be suppressed, and the deformation of the circuit board 1 in the inter-hole portions 15 can be suppressed.

As a result, the reliability of the semiconductor module can be improved in the semiconductor module (the intake air amount sensor, the sensor module) that includes the circuit board 1 on which the press-fit terminal 13 is mounted.

Since the second resin 23 on the surface 1a side of the circuit board 1 and the second resin 23 on the back surface 1b side of the circuit board 1 are linearly connected by the second resin 25 in the first through holes 11, the rigidity of the beam structure by the second resin 25 can be further increased.

Accordingly, the substrate deformation in the inter-hole portions 15 of the circuit board 1 can be further suppressed, and the reliability of the semiconductor module can be further improved.

Second Embodiment

In a second embodiment, a case where a connection region of the press-fit terminal 13 is covered simultaneously at the time of forming the housing in the semiconductor module (the intake air amount sensor, the sensor module) according to the first embodiment will be described.

FIG. 14 is a cross-sectional view showing a die structure that forms a housing of a circuit module according to the second embodiment of the invention, and FIG. 15 is a cross-sectional view showing a structure of a semiconductor module according to the second embodiment of the invention.

As shown in FIG. 14, in the circuit module according to the second embodiment, the cavity portion 18 that is filled with the first resin 20 in FIG. 15 is enlarged to a position that includes the press-fit connection portion in the molding die 40 that forms the housing. Therefore, as shown in FIG. 15, at the same time that the housing is formed by the first resin 20, the vicinity of the connection portion of the press-fit terminal 13 is also covered with the first resin 20, and the first through holes 11 are filled with a first resin 26.

That is, in the second embodiment, when the housing is formed of the first resin 20 by the resin molding, the first through holes 11 are simultaneously filled with the first resin 26. Therefore, in a structure of the semiconductor module (the intake air amount sensor, the sensor module) according to the second embodiment, the housing which is formed of the first resin 20 by the resin molding is formed on the surface 1a side and the back surface 1b side of the circuit board 1, and further, the first through hole 11 is filled with the first resin 26. The first resin 20 on the surface 1a side of the circuit board 1 and the first resin 20 on the back surface 1b side are integrally formed via the first resin 26 that is filled in the first through holes 11.

The upper cover 24 is bonded to the first resin 20 on the surface 1a side, and meanwhile, the lower cover 22 is bonded to the first resin 20 on the back surface 1b side, and a region of the second semiconductor chip 4 that is covered by the potting portion 10 is covered by the upper cover 24. The resin that forms the potting portion 10 covering the second semiconductor chip 4 which is a semiconductor component preferably adopts a resin for potting which has high fluidity and is different from the first resin 20 used for the housing. However, the first resin 20 (the first resin 26) and the resin that forms the potting portion 10 may also be the same resin.

According to the semiconductor module of the second embodiment, it is not necessary to use the second resin 23 (the second resin 25) which is used in the semiconductor module according to the first embodiment, the number of components can be reduced, and a process can be simplified. Further, the cost of the semiconductor module can be reduced.

Third Embodiment

FIG. 16 is a plan view showing a mounting structure of a circuit module according to a third embodiment of the invention, FIG. 17 is a cross-sectional view before a press-fit terminal connection showing a press-fitting state of a press-fit terminal taken along a line B-B shown in FIG. 16 according to the third embodiment of the invention, and FIG. 18 is a cross-sectional view after the press-fit terminal connection showing a press-fitting state of the press-fit terminal taken along the line B-B shown in FIG. 16 according to the third embodiment of the invention. Further, FIG. 19 is a cross-sectional view corresponding to a structure taken along the line B-B in FIG. 7 in a semiconductor module according to the third embodiment of the invention, FIG. 20 is a cross-sectional view corresponding to a structure taken along the line C-C in FIG. 7 in the semiconductor module according to the third embodiment of the invention, and FIG. 21 is a plan view showing another mounting structure of the circuit module according to the third embodiment of the invention.

The third embodiment differs from the first embodiment and the second embodiment in that second through holes 27 are formed on both sides of the first through hole 11 along the arrangement direction of the plurality of first through holes 11, as shown in FIG. 16. More specifically, a plurality of second through holes 27 are formed around each of the plurality of first through holes 11, and a part of the plurality of second through holes 27 are arranged on both sides of the first through hole 11 along the arrangement direction of the plurality of first through holes 11 in a straight line along with the first through holes 11 as seen in a plan view.

Since the inter-hole portion 15 which is a region between the adjacent first through holes 11 is easily deformed particularly under a load from the elastic deformation portion 14 of the press-fit terminal 13 shown in FIG. 17, the second through hole 27 is preferably formed at least in the inter-hole portion 15, as shown in FIG. 16.

Further, when the press-fit terminals 13 shown in FIG. 18 are inserted (press-fitted) into the respective first through holes 11 shown in FIG. 17, a load in a Y-axis direction received from the elastic deformation portion 14 of the press-fit terminal 13 can be absorbed by the second through holes 27 since the second through holes 27 are formed at least in the inter-hole portion 15 or on both sides of the first through hole 11. Accordingly, a deformation of the inter-hole portion 15 in the Y-axis direction (the substrate thickness direction) can be suppressed.

As described above, the second through holes 27 have an effect of suppressing the deformation in the Z-axis direction by absorbing the deformation in the Y-axis direction with respect to the substrate deformation in the inter-hole portions 15 as shown in FIG. 6. However, when the product is used as it is, a deformation absorption in the Y-axis direction may become excessive due to an elastic restoring force of the elastic deformation portion 14 of the press-fit terminal 13, a pressing force which is applied to the conductor foil 12 that is formed on the inner wall of the first through hole 11 of the elastic deformation portion (the pressure contact portion) 14 is weakened, and an electrical connection of the press-fit terminal 13 cannot be maintained.

Therefore, in the semiconductor module according to the third embodiment, as shown in FIG. 19 and FIG. 20, the first through hole 11 is similarly filled with the second resin 25 as in the first embodiment, and the second through hole 27 is formed with a second resin 28 as shown in FIG. 19.

As a result, in the semiconductor module according to the third embodiment, the second resin (the resin portion) 23 on the surface 1a side of the circuit board 1 and the second resin (the resin portion) 23 on the back surface 1b side of the circuit board 1 are integrally formed via the second resin 28 filled in each of the plurality of second through holes 27. The second resin 23 on the surface 1a side of the circuit board 1 and the second resin 23 on the back surface 1b side of the circuit board 1 are also integrally connected to the second resin 25 in the first through holes 11. That is, in the semiconductor module according to the third embodiment, the second resin 23 on the surface 1a side of the circuit board 1 and the second resin 23 on the back surface 1b side of the circuit board 1 are integrally connected via the second resin 25 in the first through holes 11 and the second resin 28 in the second through holes 27.

Accordingly, a mechanism of the deformation of the circuit board 1 in the Z-axis direction is the same as that of the semiconductor modules according to the first embodiment and the second embodiment, that is, since the first through hole 11 is filled with the second resin 25, the restraining force of the inter-hole portion 15 can be increased, and the load in the Y-axis direction received from the elastic deformation portion 14 of the press-fit terminal 13 shown in FIG. 17 can be absorbed by the second through holes 27 so as to suppress the substrate deformation in the inter-hole portions 15. Further, since the second through holes 27 are filled with the second resin 28 as shown in FIG. 19, the excessive deformation absorption in the Y-axis direction can be suppressed, and as a result, the electrical connection of the press-fit terminal 13 can be maintained.

From the above, the reliability of the semiconductor module according to the third embodiment can be improved.

As shown in another mounting structure of the circuit module in FIG. 21, the second through hole 27 may be a long hole such as an elliptical hole as seen in the plan view. That is, any of the plurality of second through holes 27 may have a long hole shape that includes an ellipse whose length in a direction (the X direction) that intersects an arrangement direction (the Y-axis direction) is formed to be larger than a length in the arrangement direction (the Y-axis direction) of the plurality of second through holes 27 in a shape of the hole as seen in plan view and the like.

The second through hole 27 of the long hole is preferably provided in an inter-hole portion 29 which is a region between the adjacent first through holes 11 where the substrate deformation is presumed to be particularly large. Since the shape of the second through hole 27 as seen in the plan view is formed with the length in the direction (the X direction) that intersects the arrangement direction being larger than the length in the arrangement direction (the Y-axis direction) of the second through holes 27, the load in the Y-axis direction received from the elastic deformation portion 14 of the press-fit terminal 13 can be absorbed by a portion of the long hole where an opening area in a longitudinal direction is wide. Accordingly, the second through hole 27 is more easily deformed, and the substrate deformation in the inter-hole portion 29 can be further suppressed.

In addition, the second through hole 27 can be formed even in a region with a small area such as the region (the inter-hole portion 29) between the first through hole 11 and the first through hole 11 since the second through hole 27 is formed as the long hole.

Fourth Embodiment

FIG. 22 is a plan view showing a mounting structure of a circuit module according to a fourth embodiment of the invention, FIG. 23 is a cross-sectional view of an electronic control device (a semiconductor module) corresponding to a structure taken along a line A-A shown in FIG. 22, and FIG. 24 is a perspective view showing a structure of an automobile equipped with a unit on which the electronic control device shown in FIG. 23 is mounted.

In a fourth embodiment, a case where a semiconductor module is an electronic control device which is mounted on an automobile will be described as an example. A plurality of control chips are mounted on the electronic control device, and information obtained from an external device such as a sensor is collected and calculated to output an input signal to an external device such as an actuator.

The semiconductor module shown in FIG. 23 is assembled in the same procedure as described in the first embodiment, the circuit module (the module in which the press-fit terminals 13 are inserted (press-fitted) into the first through holes 11 of the circuit board 1 shown in FIG. 22) is clamped using upper and lower dies, and the first resin 20 is filled to form a housing. Accordingly, the exposed portion 13a of the press-fit terminal 13 is exposed from the first resin 20. Further, after the lower cover 22 is bonded to the housing that is formed of the first resin 20, the second resin 23 is injected into a region surrounded by the first resin 20 and the lower cover 22. Accordingly, the first through holes 11 of the circuit board 1 are also filled with the second resin 25. After the injection of the second resin 23 is completed, the upper cover 24 is finally bonded to the first resin 20 and the electronic control device (the semiconductor module) shown in FIG. 23 is completed.

In the electronic control device, as shown in FIG. 22, a plurality of elements such as the first semiconductor chip 3, the second semiconductor chip 4, a third semiconductor chip 30, a fourth semiconductor chip 31, and a fifth semiconductor chip 32 are electrically connected to the wiring pads 9 via the wires 7. Therefore, each semiconductor chip, the wire 7 and the like are collectively covered with the second resin 23 without the potting portion 10 that is used in the first embodiment being formed.

An automobile 50 shown in FIG. 24 is equipped with the semiconductor module shown in FIG. 23, and includes a vehicle body 51, a tire 52, and a mounting unit 33 on which the semiconductor module shown in FIG. 23 is mounted. The mounting unit 33 is, for example, an engine control unit, and in this case, since the mounting unit 33 is provided in the vicinity of an engine, the mounting unit 33 is used in a high-temperature environment, and therefore, high reliability is also required for the semiconductor module that is mounted on the mounting unit 33 shown in FIG. 23.

Therefore, in the semiconductor module according to the fourth embodiment shown in FIG. 23, since the second resin 23 on the surface 1a side of the circuit board 1 and the second resin 23 on the back surface 1b side of the circuit board 1 are also integrally connected via the second resin 25 in the first through holes 11, a restraining force of the circuit board 1 in the substrate thickness direction can be increase, and accordingly, a deformation of the circuit board 1 in the inter-hole portion 15 can be reduced. As a result, the reliability of the semiconductor module according to the fourth embodiment can be improved. Further, the reliability of the automobile 50 can also be enhanced.

In the semiconductor module of the fourth embodiment shown in FIG. 23, since the second through hole 27 is also formed at least in the inter-hole portion 15 as shown in FIG. 16, a load in the Y-axis direction received from the elastic deformation portion 14 of the press-fit terminal 13 (see FIG. 17) can be absorbed by the second through hole 27 so as to suppress the substrate deformation in the inter-hole portion 15.

Accordingly, the reliability of the semiconductor module according to the fourth embodiment can be further improved, and the reliability of the automobile 50 can be further enhanced.

Although the invention made by the present inventor is described above in detail based on the embodiments, the invention is not limited to the above embodiments, and various modifications are included. For example, the embodiments described above are detailed for easy understanding, and the invention is not necessarily limited to those including all the configurations described above.

Further, a part of the configuration of one embodiment can be replaced with the configuration of another embodiment, and the configuration of another embodiment can be added to the configuration of the one embodiment. Other configurations may be added to, deleted from or replaced with a part of a configuration of each embodiment. Note that each member and the relative size described in the drawings are simplified and idealized in order to easily understand the invention, and are more complicated in terms of implementation.

In the first embodiment to fourth embodiment, a case where a semiconductor module is an intake air amount sensor or an electronic control device is taken as an example, and although an example of the semiconductor module to which a press-fit connection is applied is shown in the intake air amount sensor and the electronic control device, the invention is not limited thereto, and also may be applied to any module in which a press-fit connection is applied to a circuit board.

REFERENCE SIGN LIST

1 circuit board
1a surface (first surface)
1b back surface (second surface)
3 first semiconductor chip (semiconductor component)
4 second semiconductor chip (semiconductor component)
10 potting portion (another resin)
11 first through hole
12 conductor foil (conductor portion)
13 press-fit terminal (connecting conductor member)
14 elastic deformation portion (pressure contact portion)
20 first resin
23 second resin (resin portion)
25 second resin
26 first resin
27 second through hole
28 second resin
40 molding die
50 automobile

The invention claimed is:

1. A semiconductor module comprising:
a semiconductor component;
a circuit board that has a first surface on which the semiconductor component is mounted and a second surface opposite to the first surface, and includes a first through hole in which a conductor portion is formed;
a connecting conductor member that is press-fitted into the first through hole of the circuit board; and
a resin portion that is disposed on the first surface side and the second surface side of the circuit board, wherein
the connecting conductor member includes a pressure contact portion that is electrically connected to the conductor portion in the first through hole, and
the resin portion on the first surface side of the circuit board and the resin portion on the second surface side of the circuit board are integrally formed via a resin filled in the first through hole.

2. The semiconductor module according to claim 1, wherein
the resin that is filled in the first through hole is arranged on a straight line that connects the resin portion on the first surface side of the circuit board and the resin portion on the second surface side of the circuit board.

3. The semiconductor module according to claim 1, wherein
the connecting conductor member has an elastic structure at the pressure contact portion, and
an inner wall of the first through hole is pressed by the elastic structure so that the connecting conductor member is in contact with the conductor portion formed on the inner wall.

4. The semiconductor module according to claim 1, wherein
the semiconductor module is an electronic control device that is mounted on an automobile.

5. The semiconductor module according to claim 1, further comprising:
a housing that is formed of a first resin by resin molding on the first surface side and the second surface side of the circuit board, wherein
the first through hole is filled with the first resin, and
the first resin on the first surface side of the circuit board and the first resin on the second surface side of the circuit board are integrally formed via the first resin filled in the first through hole.

6. The semiconductor module according to claim 5, wherein
the semiconductor component is covered with another resin that is different from the first resin.

7. The semiconductor module according to claim 1, further comprising:
a housing that is formed of a first resin by resin molding on the first surface side and the second surface side of the circuit board, wherein
the resin portion that is formed in a region inside the housing on the first surface side of the circuit board and the resin portion that is formed in a region inside the housing on the second surface side of the circuit board are integrally formed via a second resin which is different from the first resin and is filled in the first through hole.

8. The semiconductor module according to claim 7, wherein
a hardness of the first resin is greater than a hardness of the second resin.

9. The semiconductor module according to claim 1, wherein
the semiconductor module is a sensor that detects a physical quantity.

10. The semiconductor module according to claim 9, wherein
the semiconductor module is a flow sensor.

11. The semiconductor module according to claim 1, wherein
a plurality of second through holes which are different from the first through hole are formed around the first through hole in the circuit board, and
the resin portion on the first surface side of the circuit board and the resin portion on the second surface side of the circuit board are integrally formed via a resin filled in each of the plurality of second through holes.

12. The semiconductor module according to claim 11, wherein
a plurality of first through holes are formed in the circuit board,
the connecting conductor member is press-fitted into each of the plurality of first through holes, and
any one of the plurality of second through holes is formed between two adjacent first through holes.

13. The semiconductor module according to claim 12, wherein
any of the plurality of first through holes and the plurality of second through holes are arranged in a straight line as seen in a plan view.

14. The semiconductor module according to claim 12, wherein
any of the plurality of second through holes has a length in a direction that intersects an arrangement direction larger than a length in the arrangement direction of the plurality of second through holes in a shape of the hole as seen in the plan view.

\* \* \* \* \*